(12) United States Patent
Choi et al.

(10) Patent No.: US 11,109,488 B2
(45) Date of Patent: Aug. 31, 2021

(54) ELECTRONIC PANEL ASSEMBLY INCLUDING CIRCUIT BOARD ASSEMBLY AND METHOD FOR MANUFACTURING THE SAME

(71) Applicant: SAMSUNG DISPLAY CO., LTD., Yongin-si (KR)

(72) Inventors: DooSub Choi, Daejeon (KR); Joong-Soo Moon, Asan-si (KR); Sangmin Kang, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/829,472

(22) Filed: Mar. 25, 2020

(65) Prior Publication Data
US 2020/0315018 A1    Oct. 1, 2020

(30) Foreign Application Priority Data

Mar. 26, 2019   (KR) .................. 10-2019-0034026

(51) Int. Cl.
*H05K 1/18* (2006.01)
*H05K 1/02* (2006.01)
(Continued)

(52) U.S. Cl.
CPC .......... *H05K 1/189* (2013.01); *G02F 1/13452* (2013.01); *G09F 9/301* (2013.01);
(Continued)

(58) Field of Classification Search
CPC ........ H05K 1/189; H05K 1/028; H05K 1/147; H05K 2201/10128; G02F 1/13452; G09F 9/301; H01L 27/32
See application file for complete search history.

(56) References Cited

U.S. PATENT DOCUMENTS 5,777,610 A  *  7/1998  Sugimoto .............. H05K 1/147
                                                        345/206
5,841,414 A  *  11/1998  Tanaka ................. G09G 3/3611
                                                        345/87
(Continued)

FOREIGN PATENT DOCUMENTS

KR       101035066 B1    5/2011
KR       1020160092123 A  8/2016
KR       1020170040435 A  4/2017

*Primary Examiner* — Hoa C Nguyen
(74) *Attorney, Agent, or Firm* — Cantor Colburn LLP

(57) ABSTRACT

A circuit board assembly includes a flexible circuit board including a first surface, a second surface opposite to the first surface, sensing pads on the first surface, and a connector on the second surface, a first liner which includes a first rear surface covering a portion of the first surface and a first top surface that is opposite to the first rear surface and in which a first opening passing through the first rear surface from the first top surface is defined, a second liner which includes a second rear surface covering a portion of the second surface and a second top surface that is opposite to the second rear surface and in which a second opening passing through the second rear surface from the second top surface is defined. Each of the first and second openings is spaced apart from the flexible circuit board in a plan view.

20 Claims, 20 Drawing Sheets

(51) Int. Cl.
*G09F 9/30* (2006.01)
*G02F 1/1345* (2006.01)
*H01L 27/32* (2006.01)
*H05K 1/14* (2006.01)

(52) U.S. Cl.
CPC ............ *H01L 27/32* (2013.01); *H05K 1/028*
(2013.01); *H05K 1/147* (2013.01); *G02F*
*2202/28* (2013.01); *H01L 2227/32* (2013.01);
*H05K 2201/10128* (2013.01)

(56) References Cited

U.S. PATENT DOCUMENTS

| | | | |
|---|---|---|---|
| 6,972,966 B1 * | 12/2005 | Oishi | H05K 1/141 |
| | | | 174/250 |
| 8,497,430 B2 * | 7/2013 | Kuwajima | G06F 3/041 |
| | | | 174/250 |
| 10,080,281 B2 | 9/2018 | Jung et al. | |
| 2008/0164056 A1 * | 7/2008 | Gettemy | H05K 1/147 |
| | | | 174/260 |
| 2016/0073498 A1 * | 3/2016 | Yeo | H05K 1/111 |
| | | | 361/748 |
| 2017/0099736 A1 | 4/2017 | Jung et al. | |
| 2017/0188469 A1 * | 6/2017 | Taguchi | B32B 15/20 |
| 2018/0217465 A1 * | 8/2018 | Nagata | G02F 1/133514 |
| 2019/0208642 A1 * | 7/2019 | Eun | H05K 1/189 |

* cited by examiner

ELECTRONIC PANEL ASSEMBLY INCLUDING CIRCUIT BOARD ASSEMBLY AND METHOD FOR MANUFACTURING THE SAME

This application claims priority to Korean Patent Application No. 10-2019-0034026, filed on Mar. 26, 2019, and all the benefits accruing therefrom under 35 U.S.C. § 119, the content of which in its entirety is herein incorporated by reference.

BACKGROUND

1. Field

Exemplary embodiments of the invention herein relate to an electronic device assembly including a circuit board assembly and a method for manufacturing the same, and more particularly, to an electronic panel assembly including a circuit board assembly having improved reliability and a method for manufacturing the same.

2. Description of Related Art

Electronic devices receive an electrical signal so as to be activated. The electronic devices may include an electronic panel that senses various types of inputs applied from an outside of the electronic panel. The electronic panel may be used alone or may further include a display unit for displaying an image, an input sensing unit, and the like to improve user's convenience.

Such an electronic device may include various sensing electrodes so as to be activated by an electrical signal. An area on which the sensing electrodes are activated may display information or respond to an input applied to the outside.

SUMMARY

Exemplary embodiments of the invention provide an electronic panel assembly including a circuit board assembly having improved reliability.

An exemplary embodiment of the invention provides a circuit board assembly including a flexible circuit board including a first surface, a second surface that is opposite to the first surface, a plurality of sensing pads disposed on the first surface, and a connector disposed on the second surface, a first liner which includes a first rear surface which covers at least a portion of the first surface and a first top surface that is opposite to the first rear surface and in which a first opening passing through the first rear surface from the first top surface is defined, a second liner which includes a second rear surface which covers at least a portion of the second surface and a second top surface that is opposite to the second rear surface and in which a second opening passing through the second rear surface from the second top surface is defined, where each of the first opening and the second opening is spaced apart from the flexible circuit board in a plan view.

In an exemplary embodiment, the first opening and the second opening may not overlap each other in the plan view.

In an exemplary embodiment, the first opening may expose a first area of the second rear surface of the second liner, and the second opening may expose a second area of the first rear surface of the first liner, where the first area and the second area may not overlap each other in the plan view.

In an exemplary embodiment, the first liner may have a surface area greater than a surface area of the second liner.

In an exemplary embodiment, the first liner may be relatively more rigid than the second liner.

In an exemplary embodiment, the circuit board assembly may further include an adhesion part disposed on at least a portion of the second surface and covered by the second liner.

In an exemplary embodiment, the first liner may include a base film and an adhesion layer disposed on the base film to overlap the flexible circuit board.

In an exemplary embodiment, the plurality of sensing pads may be exposed from the second liner, and the connector may be exposed from the first liner.

In an exemplary embodiment of the invention, an electronic panel assembly includes an electronic panel including a display unit, which is divided into a display area and a non-display area adjacent to the display area and includes a plurality of pixels disposed on the display area, and an input sensing unit, which is divided into a sensing area disposed to display unit to overlap the display area and a non-sensing area adjacent to the sensing area and includes a plurality of sensing electrodes and pads connected to the sensing electrodes, and a circuit board assembly connected to one end of the non-sensing area, where the circuit board assembly includes a flexible circuit board including a first surface, a second surface that is opposite to the first surface, a plurality of sensing pads disposed on the first surface and connected to the pads, and a connector disposed on the second surface and spaced apart from the pads, a first liner which covers at least a portion of the first surface and in which a first opening is defined, and a second liner which covers at least a portion of the second surface and in which a second opening is defined, where the first opening and the second opening are spaced apart from each other in a plan view.

In an exemplary embodiment, each of the first opening and the second opening may be spaced apart from the flexible circuit board.

In an exemplary embodiment, the first opening may expose a first area of the second rear surface of the second liner, and the second opening may expose a second area of the first rear surface of the first liner, where the first area and the second area may not overlap each other in the plan view.

In an exemplary embodiment, the first liner may have a surface area greater than a surface area of the second liner.

In an exemplary embodiment, the first liner may be relatively more rigid than the second liner.

In an exemplary embodiment, the circuit board assembly may further include an adhesion part disposed on at least a portion of the second surface and covered by the second liner.

In an exemplary embodiment, the first liner may include a base film and an adhesion layer disposed on the base film to overlap the flexible circuit board.

In an exemplary embodiment, the flexible circuit board may be divided into a sensing pad area on which the plurality of sensing pads is disposed, a connector area on which the connector is disposed, a connection area disposed between the sensing pad area and the connector area, a first bending area disposed between the sensing pad area and the connection area, and a second bending area disposed between the connector area and the connection area.

In an exemplary embodiment, the first bending area may be bent toward the rear surface of the electronic panel with respect to a first virtual bending axis extending in one direction, and the second bending area may be bent toward the rear surface of the electronic panel with respect to a second virtual bending axis extending in a direction crossing the one direction in the state in which the first bending area is bent.

In an exemplary embodiment, each of the first liner and the second liner may not overlap the sensing pad area and the connector area of the flexible circuit board in the plan view.

In an exemplary embodiment, the first liner may have a thickness greater than a thickness of the second liner.

In an exemplary embodiment of the invention, a method for manufacturing an electronic panel includes providing the electronic panel which is divided into a sensing area and a non-sensing area adjacent to the sensing area and on which a plurality of pads disposed on the non-sensing area are formed, providing a circuit board assembly including a first liner in which a first opening is defined, a second liner in which a second opening spaced apart from the first opening is defined, a flexible circuit board which is provided between the first liner and the second liner and on which sensing pads spaced apart from each other are formed, and an adhesion part attached between the flexible circuit board and the second liner, adsorbing a first area of the second liner, which is exposed through the first opening, through an inspirator to align the circuit board assembly on the non-sensing area, connecting the pads to the sensing pads, removing the second liner from the circuit board assembly to expose the adhesion part, adsorbing a second area of the first liner, which is exposed through the second opening, through the inspirator to bend the circuit board assembly, attaching the flexible circuit board to the electronic panel through the exposed adhesion part, and removing the first liner from the circuit board assembly.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
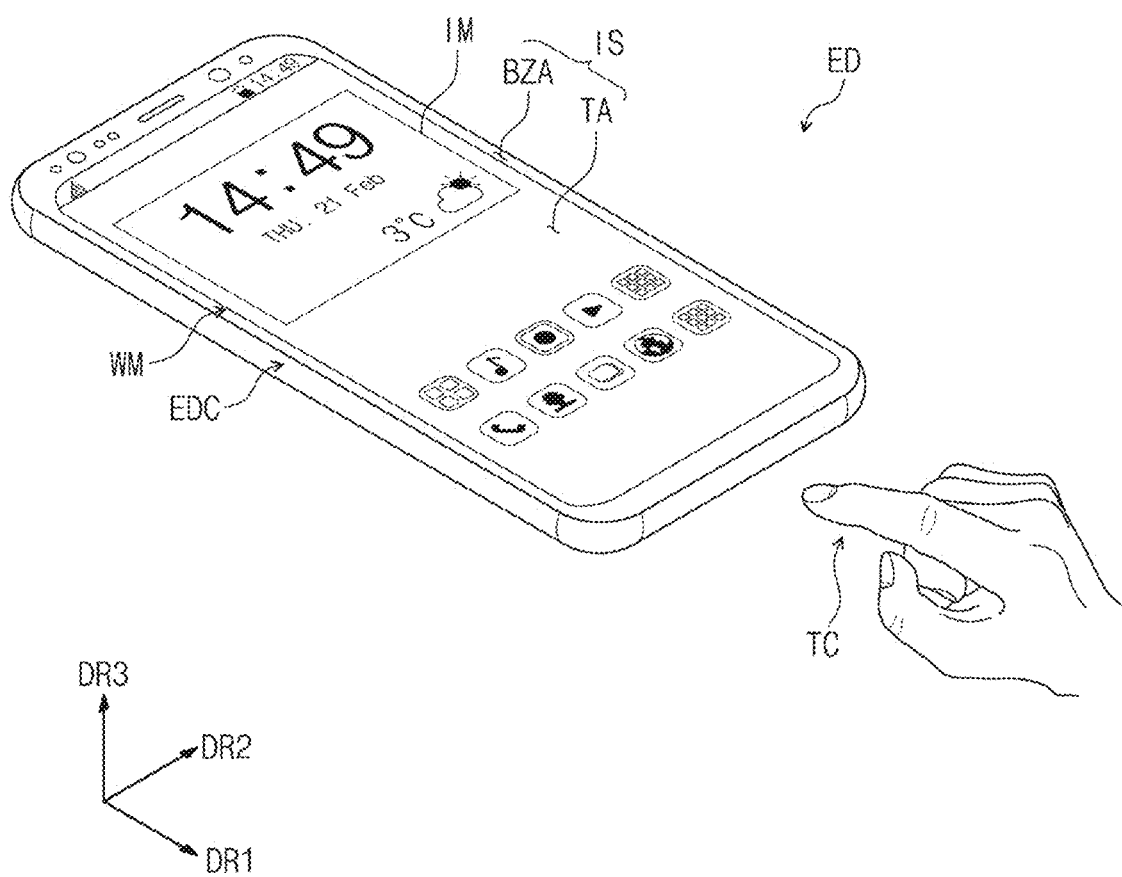
FIG. 1A is a coupling perspective view of an exemplary embodiment of an electronic device according to the invention.

In this specification, it will also be understood that when one component (or region, layer, portion, etc.) is referred to as being 'on', 'connected to', or 'coupled to' another component, it can be directly disposed/connected/coupled on/to the one component, or an intervening third component may also be present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one exemplary embodiment can be referred to as a second element in another exemplary embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof. Hereinafter, exemplary embodiments of the invention will be described with reference to the accompanying drawings.

Figure 1B:
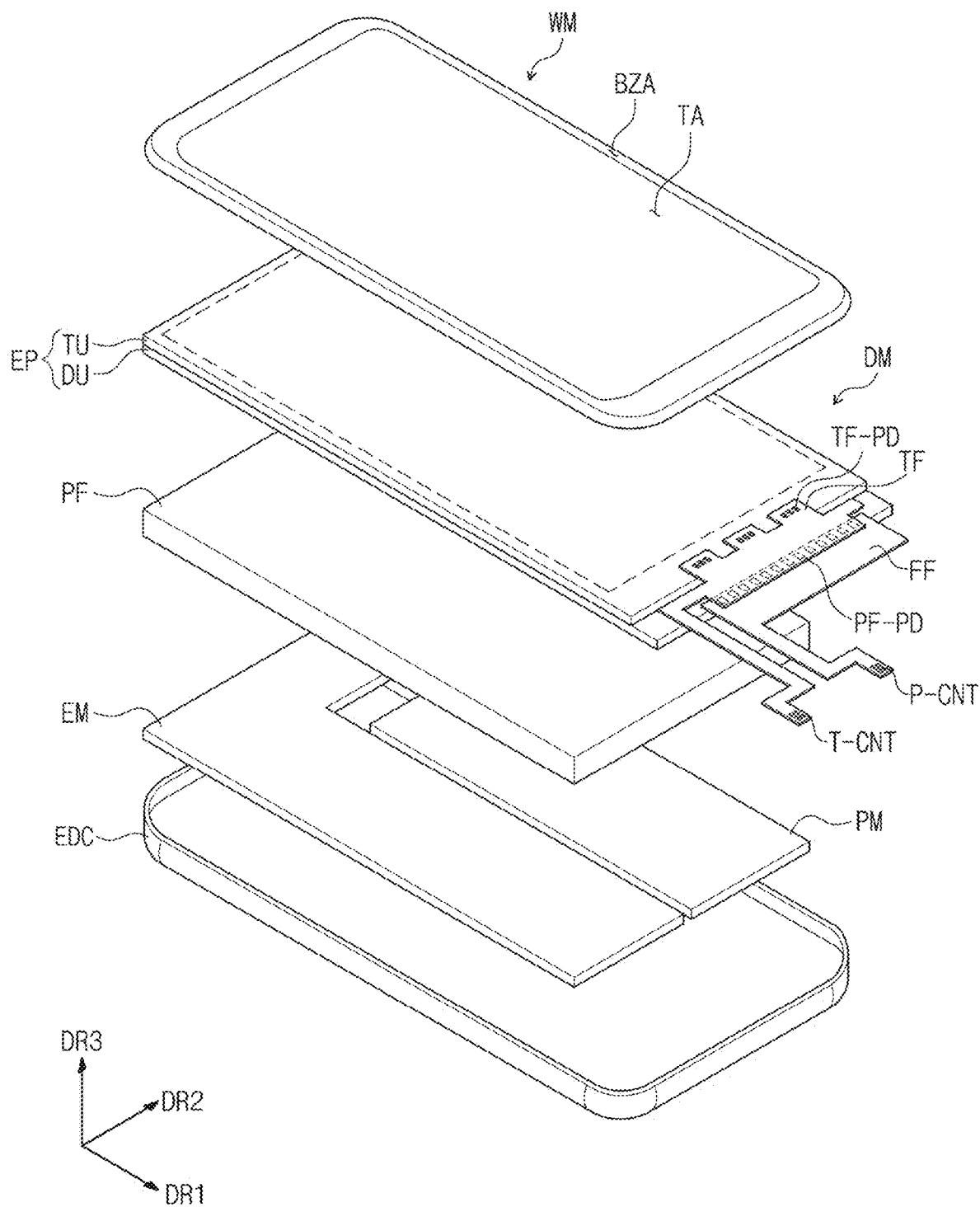
FIG. 1B is an exploded perspective view of the electronic device of FIG. 1A.
Figure 1C:
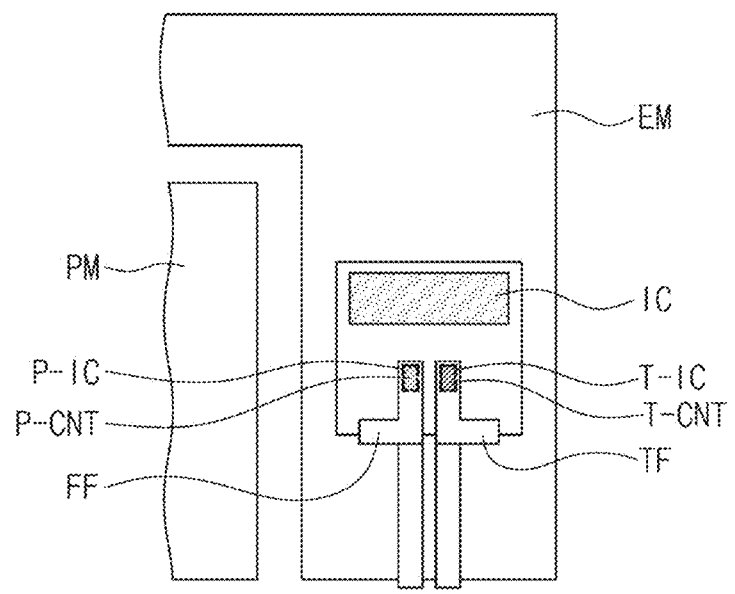
FIG. 1C is a plan view illustrating an exemplary embodiment of a rear surface of an electronic panel assembly according to the invention.
Figure 1C:
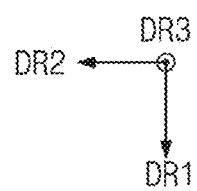
Figure 2A:
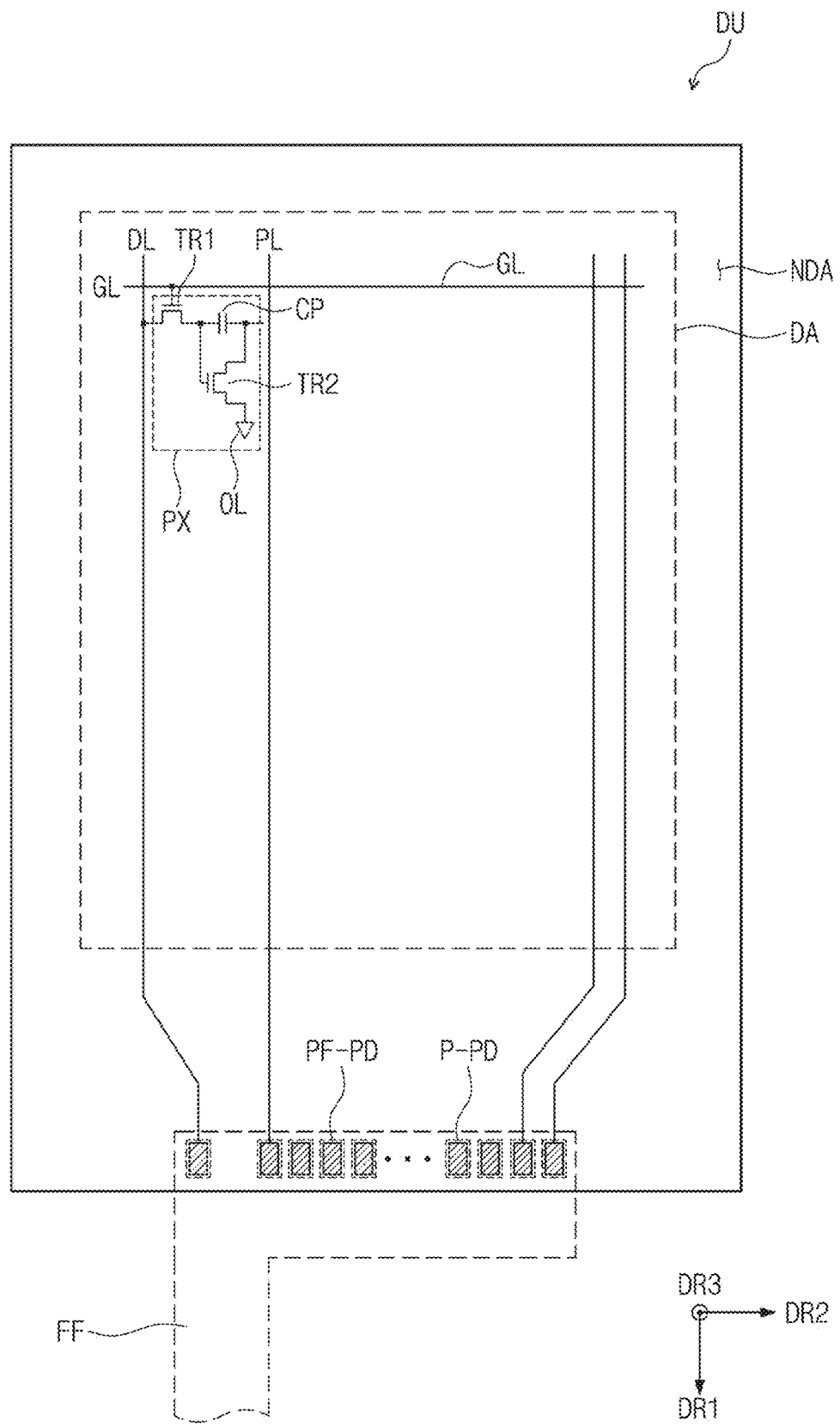
FIG. 2A is a plan view of an exemplary embodiment of a display unit according to the invention.
Figure 2B:
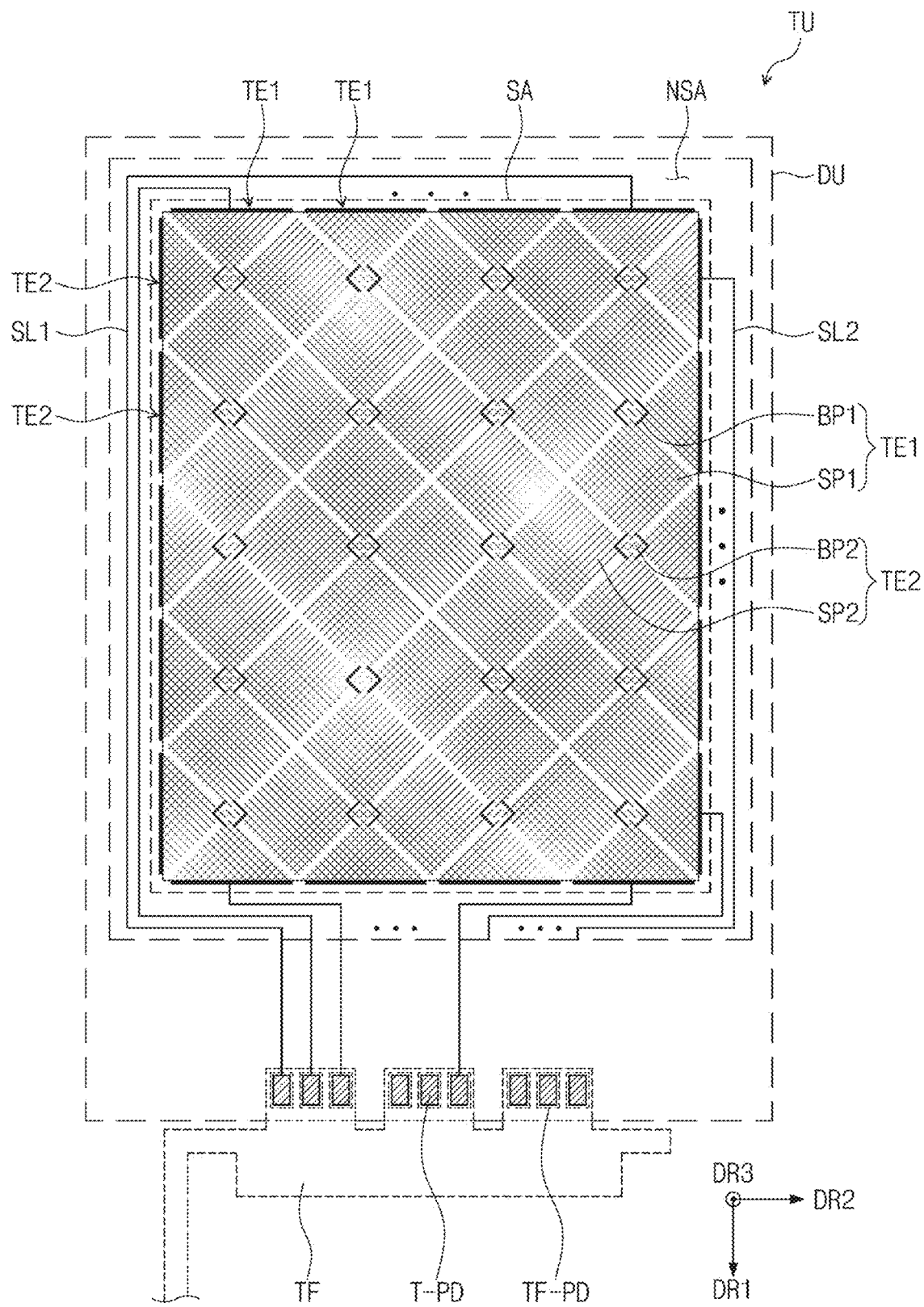
FIG. 2B is a plan view of an exemplary embodiment of an input sensing unit according to the invention.
Figure 3:
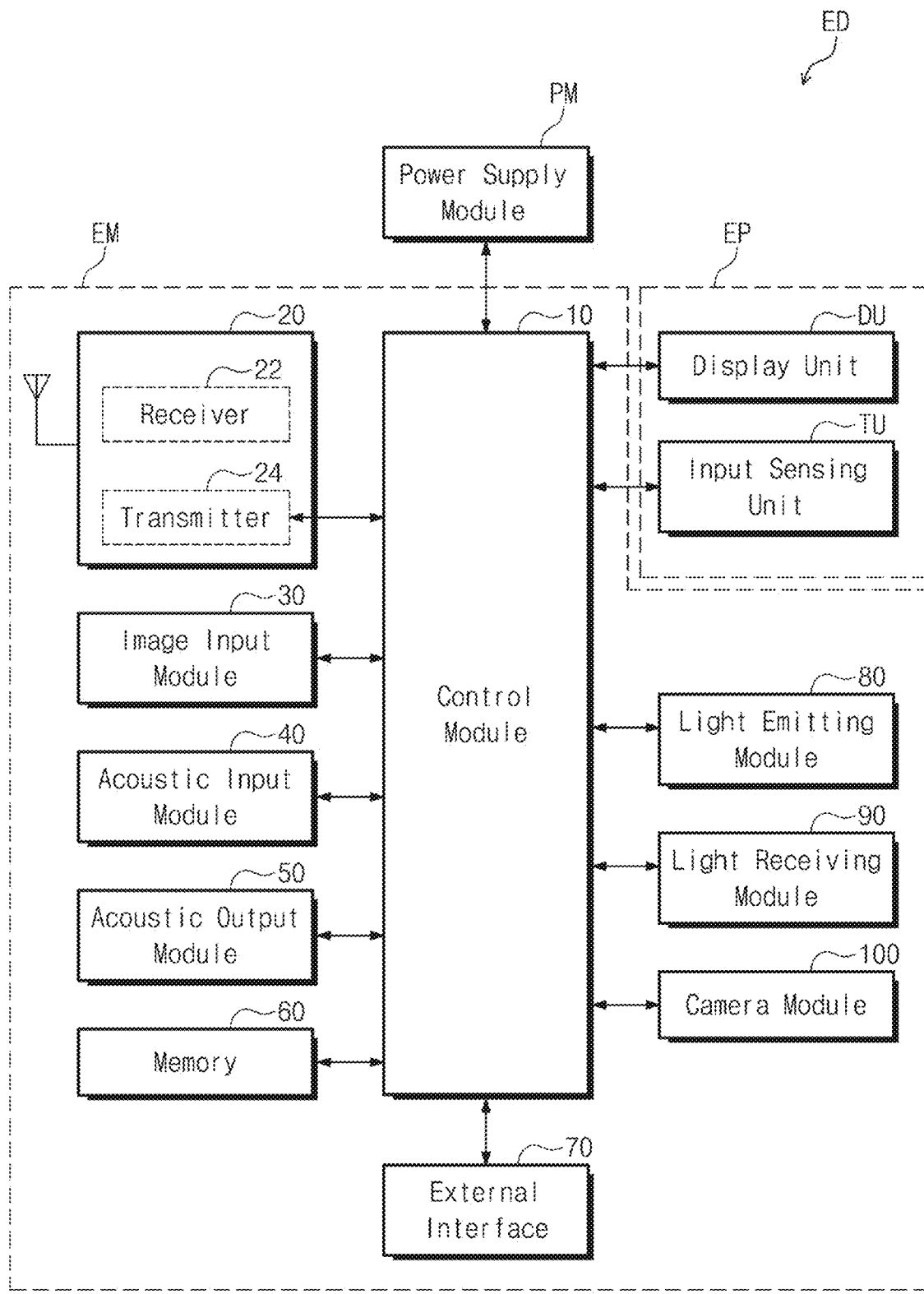
FIG. 3 is a block diagram of the electronic device of FIG. 1A.

FIG. 1A is a coupling perspective view of an exemplary embodiment of an electronic device according to the invention. FIG. 1B is an exploded perspective view of the electronic device of FIG. 1A. FIG. 1C is a plan view illustrating an exemplary embodiment of a rear surface of an electronic panel assembly according to the invention. FIG. 2A is a plan view of an exemplary embodiment of a display unit according to the invention. FIG. 2B is a plan view of an exemplary embodiment of an input sensing unit according to the invention. FIG. 3 is a block diagram of the electronic device of FIG. 1A.

Referring to FIGS. 1A and 1B, an electronic device ED may be a device that is activated according to an electrical signal. The electronic device ED may include various examples. In an exemplary embodiment, the electronic device ED may include a tablet, a notebook, a computer, a smart television, and the like, for example. In this exemplary embodiment, an electronic device ED including a smart phone will be described as an example.

The electronic device ED may display an image IM in a third direction DR3 on a display surface IS parallel to each of first and second directions DR1 and DR2. The display surface IS on which the image IM is displayed may correspond to a front surface of the electronic device ED. The image IM may include a still image as well as a dynamic image. FIG. 1A illustrates an Internet search window as an exemplary embodiment of the image IM.

In this exemplary embodiment, a front surface (or a top surface) or a rear surface (or a bottom surface) of each of members may be defined based on a direction in which the image IM is displayed. The front and rear surfaces may be opposite to each other in the third direction DR3. A normal direction of each of the front and rear surfaces may be parallel to the third direction DR3.

A spaced distance between the front and rear surfaces in the third direction DR3 may correspond to a thickness/height of the electronic device ED in the third direction DR3. The directions indicated as the first to third direction DR1, DR2, and DR3 may be a relative concept and thus changed into different directions. Hereinafter, the first to third directions may be directions indicated by the first to third directions DR1, DR2, and DR3 and designated by the same reference numerals, respectively.

The front surface of the electronic device ED may be divided into a transmission area TA and a bezel area BZA. The transmission area TA may be an area on which the image IM is displayed. A user may see the image IM through the transmission area TA. In this exemplary embodiment, each of vertexes of the transmission area TA may have a rounded rectangular shape. However, this is merely an example. In other exemplary embodiments, the electronic device ED may have various shapes and is not limited to a specific exemplary embodiment, for example.

The bezel area BZA is adjacent to the transmission area TA. The bezel area BZA may have a predetermined color. The bezel area BZA may surround the transmission area TA. However, this is merely an example. In other exemplary embodiments, the bezel area BZA may be disposed adjacent to only one side of the transmission area TA or be omitted, for example. The electronic device ED may include various exemplary embodiments, and is not limited to a specific exemplary embodiment.

The electronic device ED may sense an external input TC applied from the outside. The external input TC may include various types of inputs provided from the outside of the electronic device ED. The external input TC applied from the outside may be provided in various forms.

In an exemplary embodiment, the external input TC may include an external input (for example, hovering) applied to be proximity to or adjacent by a predetermined distance to the electronic device ED as well as to contact a portion of the human body such as user's hands, for example. Also, the input may be provided as various forms such as force, a pressure, light, and the like and is not limited to any one exemplary embodiment. FIG. 1A illustrates the user's hand as an exemplary embodiment of the external input TC.

The electronic device ED may include a window layer WM, an external case EDC, an electronic panel EP, circuit boards FF and TF, a protection panel PF, an electronic module EM, and a power supply module PM.

The window layer WM is disposed on the display module DM. The window layer WM may prevent an impact from being applied from the outside and prevent foreign substances from being permeated to protect the display module DM.

The window layer WM may include a transparent material that is capable of emitting an image. In an exemplary embodiment, the window layer WM may include glass, sapphire, plastic, and the like, for example. Although the window layer WM is provided as a single layer, the invention is not limited thereto. In an exemplary embodiment, the window layer WM may include a plurality of layers, for example. Although not shown, the bezel area BZA of the above-described electronic device ED may be substantially provided as an area on which a material having a predetermined color is printed on one area of the window layer WM.

The external case EDC accommodates components of the electronic device ED. The external case EDC may be coupled to the window layer WM to define an outer appearance of the electronic device ED. The external case EDC absorbs the impact applied from the outside and prevents foreign substances/moisture from being introduced into the electronic device ED to protect the components accommodated in the external case EDC. Although not shown, the external case EDC may be provided in a shape in which a plurality of accommodation members are coupled to each other.

In this exemplary embodiment, the electronic panel EP may include a display unit DU and an input sensing unit TU. The input sensing unit TU may be disposed on the display unit DU. The input sensing unit TU may be coupled to the display unit DU by providing a separate adhesion layer (not shown) on the display unit DU, or the input sensing unit TU may be directly disposed on the display unit DU through the same process without providing the separate adhesion layer on the display unit DU, but is not limited to a specific exemplary embodiment.

FIG. 2A schematically illustrates a plan view of the display unit DU of the electronic panel EP. In this exemplary embodiment, the display unit DU may be divided into a display area DA and a non-display area NDA. The display area DA may be defined as an area on which the image IM is displayed by the display unit DU. In an exemplary embodiment, the display area DA may overlap the transmission area TA. The non-display area NDA may be an area adjacent to the display area DA to overlap the bezel area BZA.

The display unit DU receives an electrical signal to display the image IM on the display area DA. The display unit DU may be provided in various shapes. In an exemplary embodiment, the display unit DU may include an organic light emitting display panel, an electrophoretic display panel, an electrowetting display panel, and a liquid crystal display panel, for example. In this exemplary embodiment, the display unit DU that is provided as the organic light emitting display panel will be described as an example.

The display unit DU may include a plurality of signal lines GL, DL, and PL, a pixel PX, and a plurality of display pads PF-PD.

The signal lines GL, DL, and PL may include a gate line GL, a data line DL, and a power line PL. The gate line GL, the data line DL, and the power line PL may transmit electrical signals different from each other, respectively.

The gate line GL extends in the second direction DR2. The gate line GL may be provided in plural, and the plurality of gate lines GL may be arranged to be spaced apart from each other in the first direction DR1.

Although not shown, the display unit DU may further include a gate drive circuit providing an electrical signal to the gate line GL. The display unit DU may further include gate pads electrically connected to the gate drive circuit that is provided to the outside.

The data line DL extends in the first direction DR1. The data line DL may be electrically insulated from the gate line GL. The data line DL provides a data signal to the pixel PX. The data line DL may be provided in plural. The plurality of data lines DL may be arranged to be spaced apart from each other in the second direction DR2.

The power line PL extends in the first direction DR1. The power line PL may be electrically insulated from the gate line GL and the data line DL. The power line PL may provide a power signal (hereinafter, referred to as a first power signal) to the pixel PX. The power line PL may be provided in plural. The plurality of power lines PL may be arranged to be spaced apart from each other in the second direction DR2.

The pixel PX is disposed on the display area DA. The pixel PX may be provided in plural. The plurality of pixels PX may be arranged in the form of a matrix in the first direction DR1 and the second direction DR2. The pixel PX may emit light according to an electrical signal to realize the image IM.

FIG. 2A illustrates a single gate line GL, a single data line DL, a single power line PL, and a single pixel PX for easy description.

The pixel PX may include a first thin film transistor TR1, a second thin film transistor TR2, a capacitor CP, and an organic light emitting element OL. The first thin film transistor TR1, the second thin film transistor TR2, the capacitor CP, and the organic light emitting element OL may be electrically connected to each other.

The first thin film transistor TR1 may be a switching element that controls turn-on and turn-off of the pixel PX. The first thin film transistor TR1 is connected to the gate line GL and the data line DL. The first thin film transistor TR1 is turned on by a gate signal provided through the gate line GL to provide a data signal provided through the data line DL to the capacitor CP.

The capacitor CP charges a voltage corresponding to a potential difference between the first power signal provided from the power line PL and a signal provided from the thin film transistor TR1. The second thin film transistor TR2 provides the first power signal provided from the power line PL to the organic light emitting element OL to correspond to the voltage charged in the capacitor CP.

The organic light emitting element OL may generate light or control an amount of light according to the electrical signal. In an exemplary embodiment, the organic light emitting element OL may include an organic light emitting element, a quantum dot light emitting element, an electrophoretic element, or an electrowetting element, for example.

The organic light emitting element OL may be connected to a power terminal (not shown) to receive a second power signal different from the first power signal. Driving current corresponding to a difference between the electrical signal provided from the second thin film transistor TR2 and the second power signal may flow through the organic light emitting element OL, and the organic light emitting element OL may generate light corresponding to the driving current.

However, this is merely an example. In other exemplary embodiments, the pixel PX may include electronic elements having various configurations and arrangements, for example, and is not limited to a specific exemplary embodiment.

First pads P-PD are disposed on the non-display area NDA. The first pads P-PD are connected to display pads PF-PD disposed on the display circuit board FF.

The first pads P-PD may include a data pad and a power pad. The data pad is connected to the data line DL. The data line DL extends from the display area DA and then is connected to the data pad. The power pad is connected to the power line PL. The power line PL extends from the display area DA and then is connected to the power pad. Also, the first pads P-PD may include a gate pad. The gate pad may be connected to the gate drive circuit (not shown) connected to the gate line GL.

Each of the signal lines GL, DL, and PL may receive or output a signal from/to the outside through the first pads respectively connected thereto among the first pads P-PD.

FIG. 2B schematically illustrates a plan view of the input sensing unit TU disposed on the display unit DU (expressed by a dotted line).

The input sensing unit TU may include a first sensing electrode TE1, a second sensing electrode TE2, a first signal line SL1, and a second signal line SL2. The input sensing unit TU is divided into a sensing area SA that senses an external input and a non-sensing area NSA that is adjacent to the sensing area SA. The sensing area SA may overlap the display area DA. The non-sensing area NSA may overlap the non-display area NDA.

The first sensing electrode TE1 extends in the first direction DR1. The first sensing electrode TE1 may be provided in plural. The plurality of first sensing electrode TE1 may be arranged in the second direction DR2. The first sensing electrode TE1 includes a plurality of first sensor patterns SP1 arranged in the first direction DR1 and first connection patterns BP1 disposed between the first sensor patterns SP1 to connect the adjacent first sensor patterns SP1 to each other.

The second sensing electrode TE2 may be disposed to be insulated from the first sensing electrode TEL The second sensing electrode TE2 extends in the second direction DR2. The second sensing electrode TE2 may be provided in plural, and the plurality of second sensing electrodes TE2 may be arranged in the first direction DR1. The second sensing electrode TE2 includes a plurality of second sensor patterns SP2 arranged in the second direction DR2 and second connection patterns B2P disposed between the second sensor patterns SP2 to connect the adjacent second sensor patterns SP2 to each other.

The input sensing unit TU may sense a variation in mutual capacitance between the first sensing electrode TE1 and the second sensing electrode TE2 to sense the external input or sense a variation in self-capacitance of each of the first sensing electrode TE1 and the second sensing electrode TE2 to sense the external input. The input sensing unit TU in other exemplary embodiments of the invention may sense the external input in various manners, and is not limited to a specific exemplary embodiment.

The first signal line SL1 is connected to the first sensing electrode TEL The first signal line SL1 may be disposed on the non-sensing area NSA and thus may not be seen from the outside. The second signal line SL2 is connected to the second sensing electrode TE2. The second signal line SL2 may be disposed on the non-sensing area NSA and thus may not be seen from the outside.

In this exemplary embodiment, one first sensing electrode TE1 may be connected to two first signal lines. The first signal lines SL1 connected to one end and the other end of one first sensing electrode TE1 may be lines that are respectively connected to the second pads T-PD separated and independent from each other.

Thus, even though the first sensing electrode TE1 has a relatively long length when compared to that of the second sensing electrode TE2, the electrical signal may be uniformly applied to the entire area. Thus, the input sensing unit TU may provide an external input sensing environment that is uniform with respect to the entire sensing area SA regardless of the shape.

However, this is merely an example. In an exemplary embodiment, the second sensing electrode TE2 may also be connected to the two second signal lines, for example. In an alternative exemplary embodiment, each of the first sensing electrode TE1 and the second sensing electrode TE2 may be connected to only one signal line. The input sensing unit TU in other exemplary embodiments of the invention may be driven in various manners, and is not limited to one exemplary embodiment.

The second pads T-PD are disposed on the non-sensing area NSA. The second pads T-PD are connected to sensing pads TF-PD disposed on the sensing circuit board TF.

The protection panel PF may be disposed below the electronic panel EP. The protection panel PF may include functional layers that are desired for assisting the driving of the electronic panel EP. In an exemplary embodiment, the protection panel PF may include at least one of a support layer, an impact absorption layer, a heat dissipation layer, and a light blocking layer, for example.

The display circuit board FF may include display pads PF-PD and a display connector P-CNT. The display pads PF-PD and the display connector P-CNT may be spaced apart from each other and disposed on an end of the display circuit board FF. The display pads PF-PD and the display connector P-CNT may be disposed on different surfaces of the display circuit board FF.

The display circuit board FF may include a flexible base film (not shown) and a plurality of lines disposed in the base film. The plurality of lines may connect the display pads PF-PD to the display connector P-CNT.

The display circuit board FF is connected to the display unit DU. In an exemplary embodiment, the display circuit board FF may be connected on one end of the non-display area NDA, for example.

The display circuit board FF includes the display pads PF-PD corresponding to the first pads P-PD disposed on the display unit DU. The display pads PF-PD may be connected to the first pads P-PD to connect the display unit DU to the display circuit board FF.

The sensing circuit board TF may include sensing pads TF-PD and a sensing connector T-CNT. The sensing pads TF-PD and the sensing connector T-CNT may be spaced apart from each other and be disposed on an end of the sensing circuit board TF. The sensing pads TF-PD and the sensing connector T-CNT may be disposed on different surfaces of the sensing circuit board TF.

The sensing circuit board TF may include a flexible base film (not shown) and a plurality of lines disposed in the base film. The plurality of lines may connect the sensing pads TF-PD to the sensing connector T-CNT.

The sensing circuit board TF is connected to the input sensing unit TU. In an exemplary embodiment, the sensing circuit board TF may be connected to one end of the non-sensing area NSA, for example.

The sensing circuit board TF includes the sensing pads TF-PD corresponding to the second pads T-PD disposed on the input sensing unit TU. The sensing pads TF-PD may be connected to the second pads T-PD to connect the input sensing unit TU to the sensing circuit board TF.

Referring to FIG. 1C, the display circuit board FF and the sensing circuit board TF may be bent toward the rear surface of the electronic panel EP (refer to FIG. 1B). FIG. 1C illustrates an electronic module EM as an exemplary embodiment of the rear surface of the electronic panel EP.

The display connector P-CNT and the sensing connector T-CNT may be connected to connectors P-IC and T-IC connected to the driving element IC in the state in which the display circuit board FF is bent. The driving element IC may be one component of a control module 10 (refer to FIG. 3) that will be described below.

The driving element IC may include a timing controller. The timing controller receives input image signals and converts the input image signals into image data matching operations of the pixels. Also, the timing controller may receive various control signals, for example, a vertical synchronizing signal, a horizontal synchronizing signal, a main clock signal, and a data enable signal and may output signals respectively corresponding to the foregoing signals. Also, the driving element IC may further include a circuit unit controlling the input sensing unit TU. Thus, the sensing circuit board TF may transmit input sensing signals provided from the driving element IC to the input sensing unit TU or transmit input sensing coordinate data due to the external input TC to the driving element IC.

The protection panel PF may be disposed below the display module DM. The protection panel PF may include functional layers that are desired for assisting the driving of the display module DM. In an exemplary embodiment, the protection panel PF may include at least one of a support layer, an impact absorption layer, a heat dissipation layer, and a light blocking layer, for example. When the display module DM is bent, the protection panel PF may support the bent components to relieve stress.

The electronic module EM includes various functional modules disposed (e.g., mounted) on a mother board to drive the electronic device ED. The electronic module EM may be electrically connected to the electronic panel EP through a connector (not shown).

Referring to FIG. 3, the electronic module EM may include a control module 10, a wireless communication module 20, an image input module 30, an acoustic input module 40, an acoustic output module 50, a memory 60, an external interface 70, a light emitting module 80, a light receiving module 90, and a camera module 100.

The control module 10 controls an overall operation of the electronic device ED. In an exemplary embodiment, the control module 10 may be a microprocessor, for example. In an exemplary embodiment, the control module 10 may activate or inactivate the display unit DU. The control module 10 may control the image input module 30, the acoustic input module 40, and the acoustic output module 50 on the basis of a touch signal received from the display unit DU, for example.

The wireless communication module 20 may transmit/receive a wireless signal to/from the other terminal by Bluetooth or Wi-Fi. The wireless communication module 20 may transmit/receive a voice signal by a general communication line. The wireless communication module 20 includes a transmitter 24 modulating and transmitting a signal to be transmitted and a receiver 22 demodulating the received signal.

The image input module 30 processes the image signal to convert the processed image signal into image data that is capable of being displayed on the electronic panel EP. The acoustic input module 40 receives external acoustic signals by a microphone during recording mode or a voice recognition mode to convert the received acoustic signal into electrical voice data. The acoustic output module 50 converts the acoustic data received from the wireless communication module 20 or the acoustic data stored in the memory 60 to output the converted acoustic data to the outside.

The external interface 70 serves as an interface connected to an external charger, a wired/wireless data port, and a card socket (for example, a memory card and an SIM/UIM card).

The light emitting module 80 generates and outputs light. The light emitting module 80 may output infrared rays. The light emitting module 80 may include a light emitting diode ("LED"). The light receiving module 90 may sense the infrared rays. The light receiving module 90 may be activated when infrared rays having a predetermined level or a level greater than the predetermined level is sensed. In an exemplary embodiment, the light receiving module 90 may include a complementary metal-oxide-semiconductor ("CMOS") sensor, for example. The infrared rays generated in the light emitting module 80 may be outputted and then be reflected by an external object (for example, a user's finger or face), and the reflected infrared rays may be incident into the light receiving module 90. The camera module 100 photographs an external image.

The power supply module PM supplies power desired for an overall operation of the electronic device ED. The power supply module PM may include a general battery module.

Figure 4:
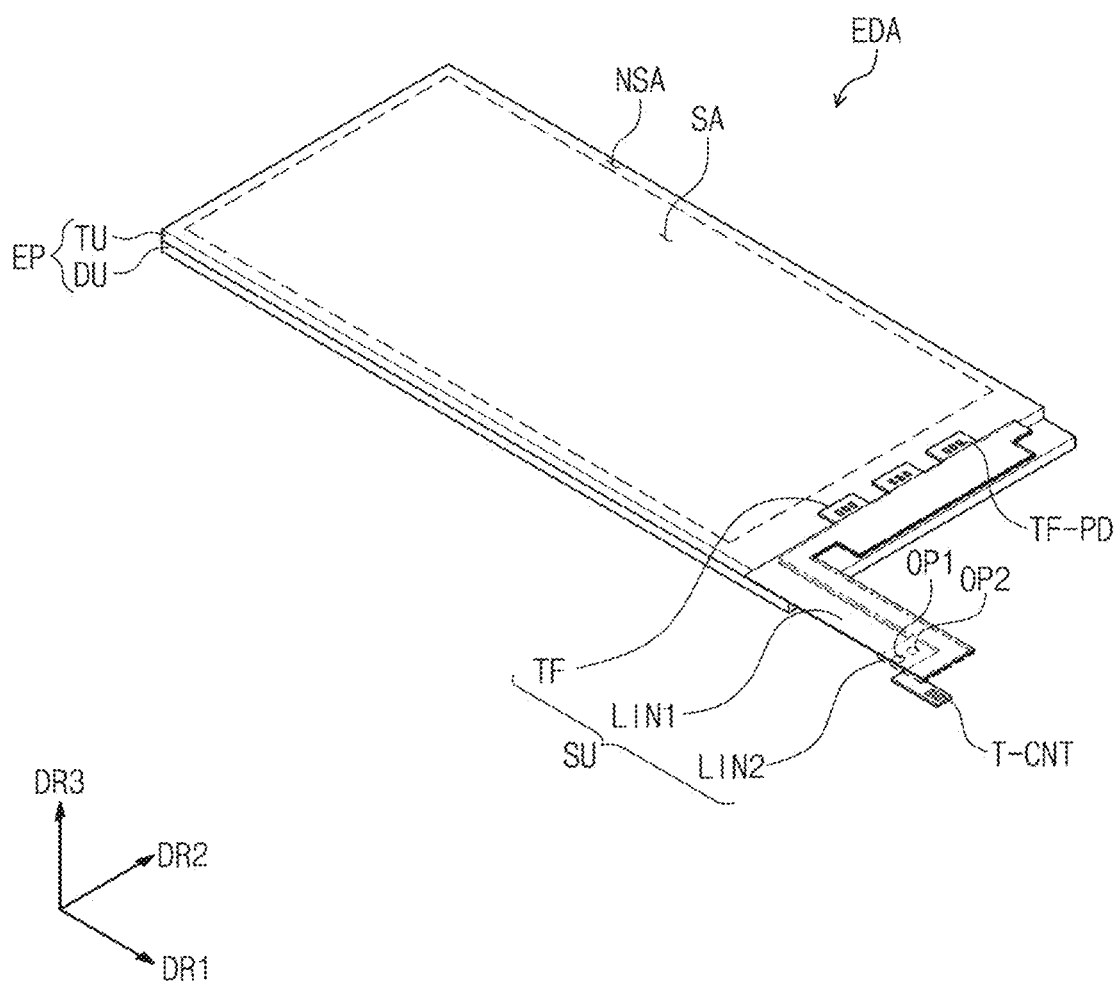
FIG. 4 is a perspective view of an exemplary embodiment of the electronic panel assembly according to the invention.
Figure 5A:
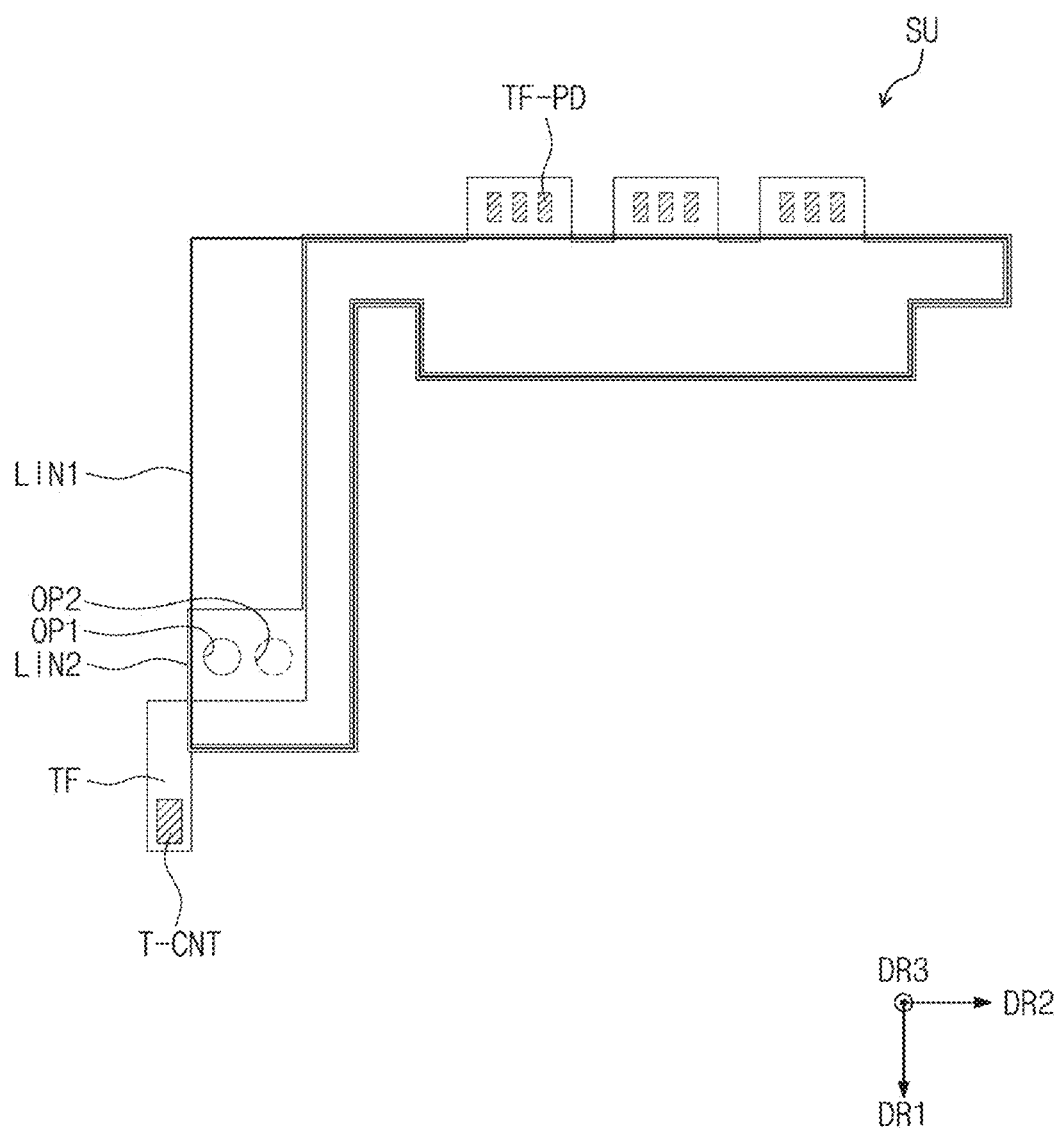
FIG. 5A is a plan view of an exemplary embodiment of a circuit board assembly according to the invention.
Figure 5B:
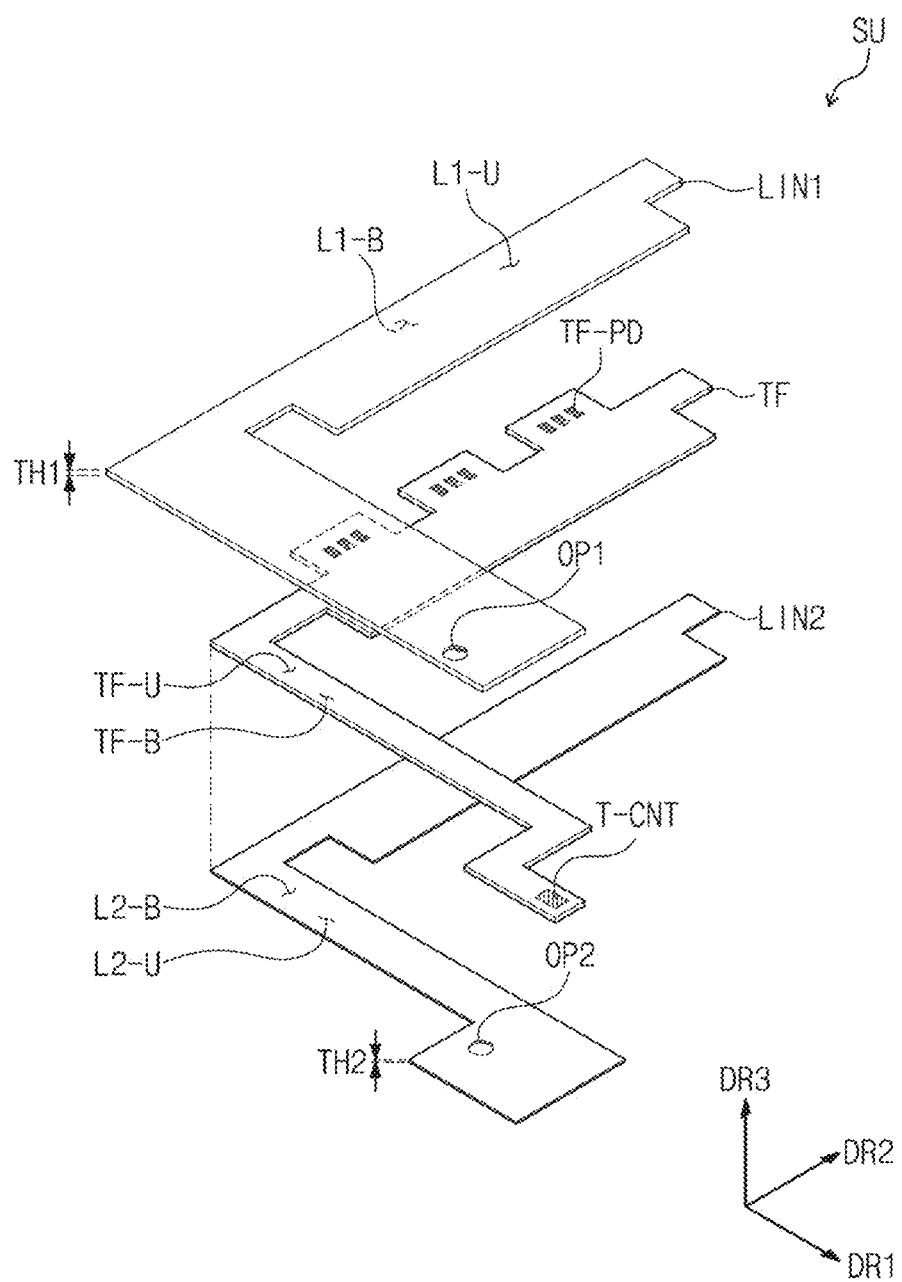
FIG. 5B is an exploded perspective view of an exemplary embodiment of the circuit board assembly.
Figure 6A:
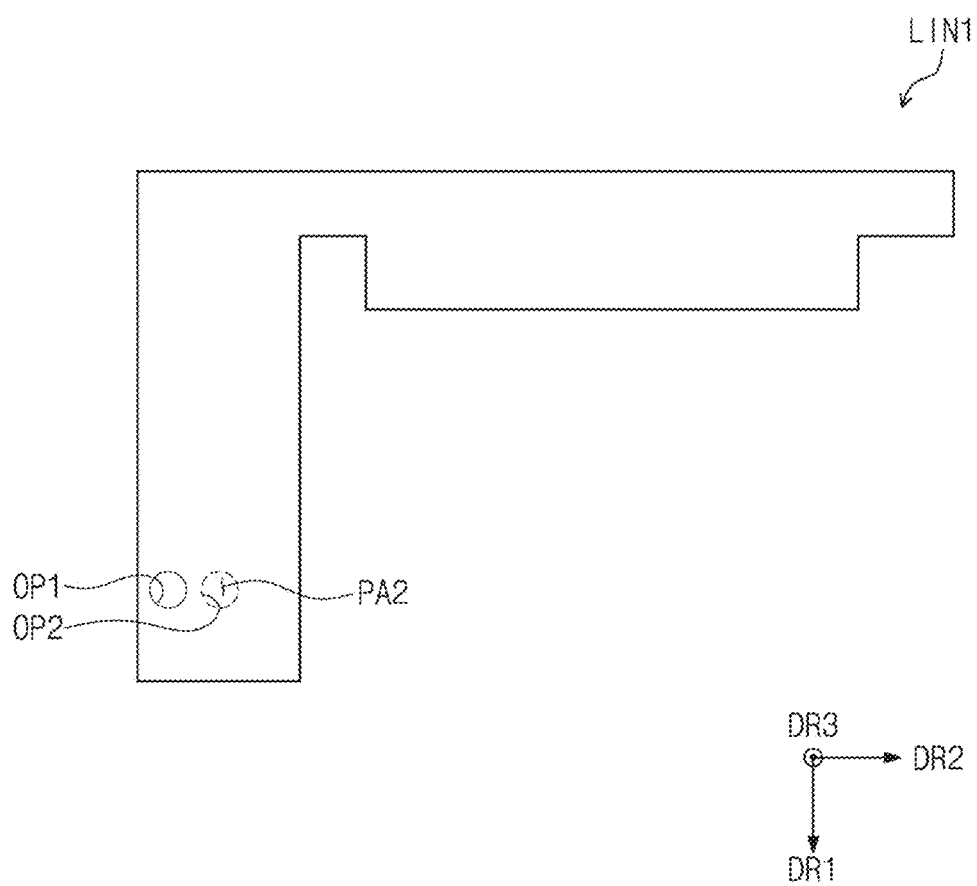
FIGS. 6A to 6C are plan views illustrating an exemplary embodiment of one component of the circuit board assembly.
Figure 6B:
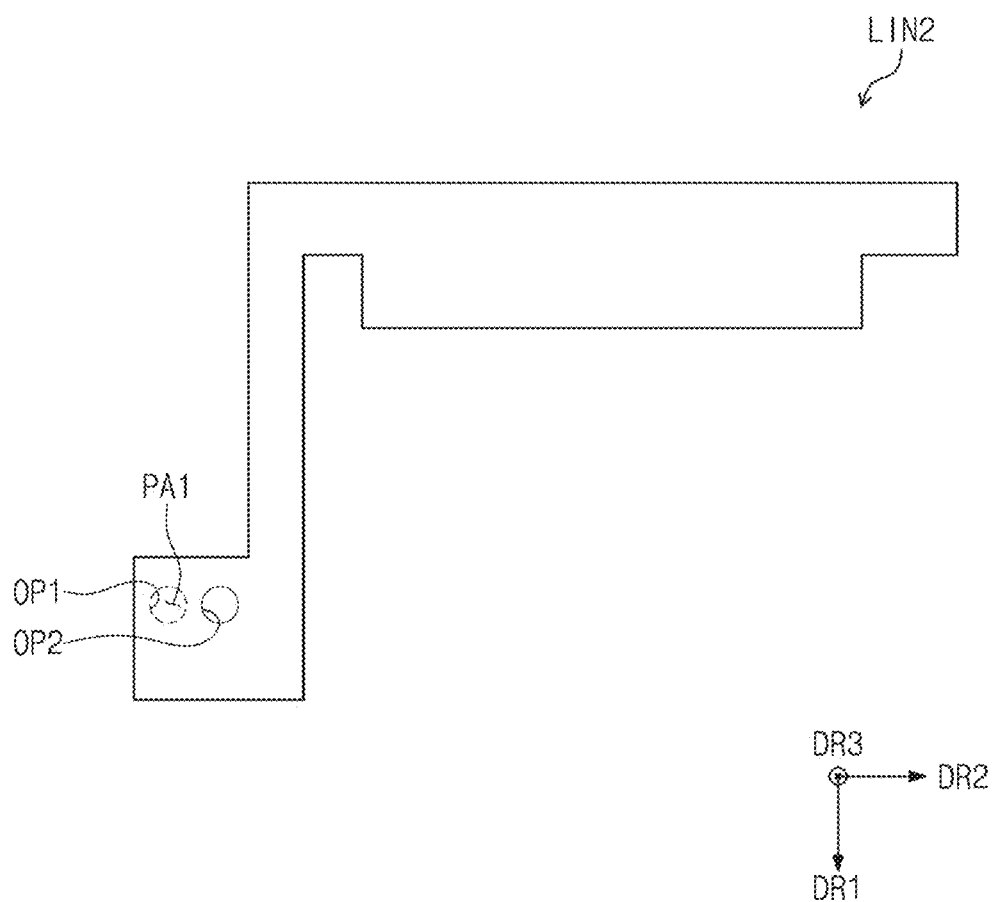
Figure 6C:
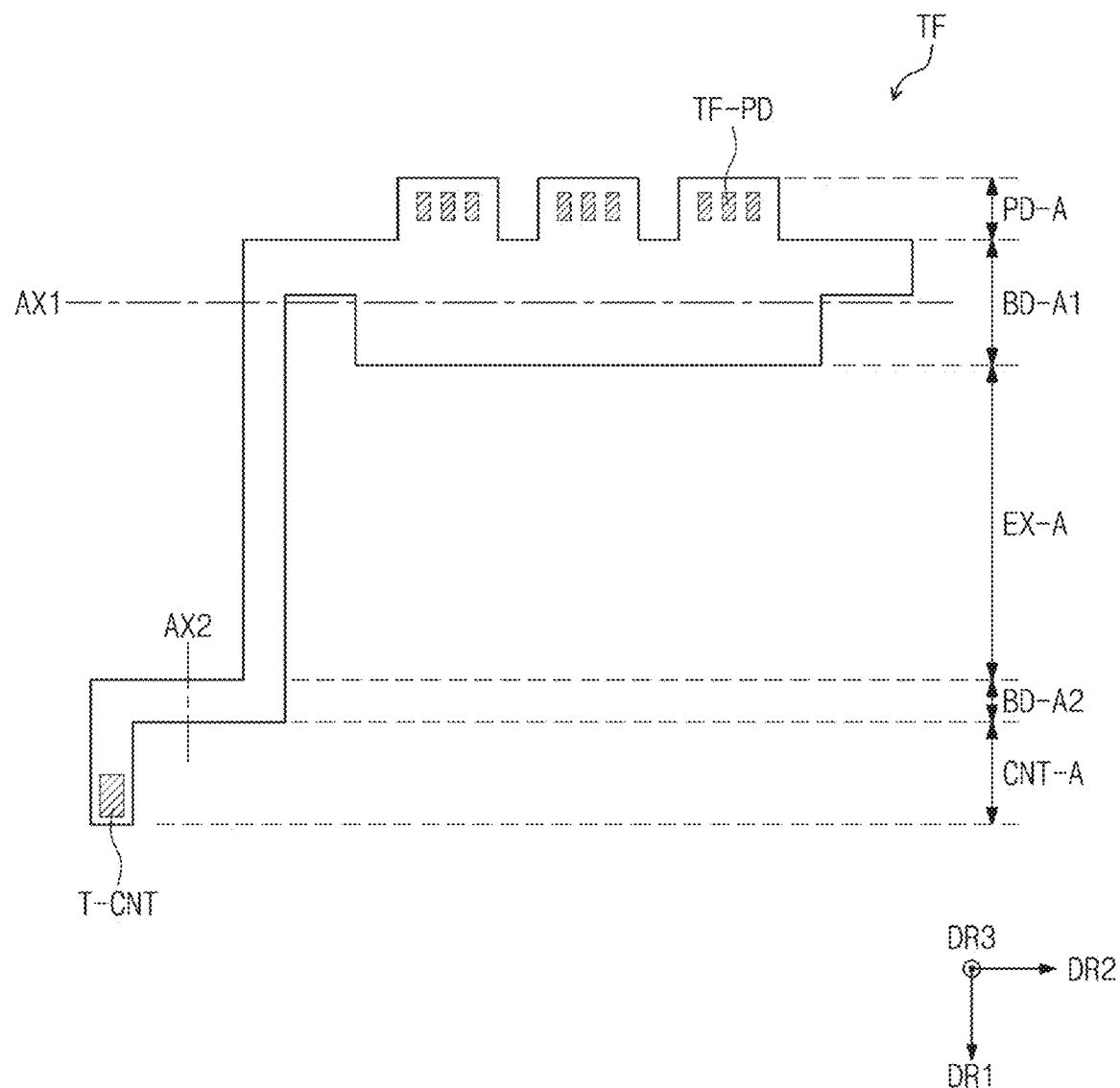

FIG. 4 is a perspective view of an exemplary embodiment of the electronic panel assembly according to the invention. FIG. 5A is a plan view of a circuit board assembly according to the invention. FIG. 5B is an exploded perspective view of an exemplary embodiment of the circuit board assembly. FIGS. 6A to 6C are plan views illustrating an exemplary embodiment of one component of the circuit board assembly. The same reference numerals are used for the same components as those of FIGS. 1A to 3, and thus, duplicated descriptions will be omitted.

Referring to FIG. 4, the electronic panel assembly EDA may include an electronic panel EP and the circuit board assembly SU. The circuit board assembly SU may include a sensing circuit board TF (hereinafter, referred to as a flexible circuit board), a first liner LIN1, and a second liner LIN2. The electronic panel EP may include a display unit DU and an input sensing unit TU.

Components of the electronic panel EP provided in the electronic panel assembly EDA may be the same as those of the electronic panel EP of the electronic device ED of FIG. 1B. Also, the flexible circuit board TF provided in the circuit board assembly SU may be the same as the sensing circuit board TF of FIG. 1B.

The liners LIN1 and LIN2 are disposed to be spaced apart from each other with reference to the flexible circuit board TF. The liners LIN1 and LIN2 may cover different surfaces of the flexible circuit board TF.

The electronic panel assembly EDA may be provided in a state in which the flexible circuit board TF covered by the liners LIN1 and LIN2 are connected to the electronic panel EP. The electronic panel assembly EDA may be a product in which the window layer WM and the external case EDC of the components of the electronic device ED of FIG. 1A are not coupled to each other.

Depending on the purpose, processes of accommodating, transferring, assembling, or storing the electronic panel assembly EDA may occur. Here, the liners LIN1 and LIN2 may cover the different surfaces of the flexible circuit board TF to prevent the flexible circuit board TF from being damaged during the accommodation, the transferring, the assembly, or the storage.

Referring to FIGS. 5A to 6C, the flexible circuit board assembly SU may include a flexible circuit board TF, a first liner LIN1, and a second liner LIN2.

The first liner LIN1 includes a first top surface L1-U and a first rear surface L1-B. The first rear surface L1-B may be defined as a surface that covers the first surface TF-U of the flexible circuit board TF and contacts at least a portion of the first surface TF-U. The first top surface L1-U is opposite to the first rear surface L1-B.

A first opening OP1 may be defined in the first liner LIN1. The opening OP1 may be defined to pass through the first rear surface L1-B from the first top surface L1-U. The first opening OP1 may expose a first area PA1 that is a portion of the second liner LIN2 to the outside.

The second liner LIN2 includes a second top surface L2-U and a second rear surface L2-B. The second rear surface L2-B may be defined as a surface that covers the second surface TF-B of the flexible circuit board TF and contacts at least a portion of the second surface TF-B. The second top surface L2-U is opposite to the second rear surface L2-B.

A second opening OP2 may be defined in the second liner LIN2. The second opening OP2 may be defined to pass through the second rear surface L2-B from the second top surface L2-U. The second opening OP2 may expose a second area PA2 that is a portion of the first liner LIN1 to the outside.

The first opening OP1 and the second opening OP2 may not overlap each other in the plan view. Thus, the first area PA1 and the second area PA2 may not overlap each other in the plan view. Also, each of the first opening OP1 and the second opening OP2 may be spaced apart from the flexible circuit board TF in the plan view. Thus, the flexible circuit board TF may be exposed by the first opening OP1 and the second opening OP2.

Although each of the openings OP1 and OP2 has a circular shape in FIGS. 5A to 6B, the invention is not limited thereto. In an exemplary embodiment, each of the openings OP1 and OP2 may have a polygonal or oval shape as long as the openings OP1 and OP2 are spaced apart from each other and do not overlap the flexible circuit board TF in the plan view, for example, but the invention is not limited thereto.

The first liner LIN1 may relieve stress applied to the flexible circuit board TF when the flexible circuit board TF is coupled to the electronic panel EP (refer to FIG. 1C) and then bent. Also, the first liner LIN1 may prevent an impact from being applied from the outside in the bent state and prevent foreign substances from being introduced.

The second liner LIN2 may protect one component disposed on the second surface TF-B of the flexible circuit board TF. In an exemplary embodiment, the flexible circuit board TF may be bent through an adhesion part (not shown) disposed on the second surface TF-B and then be coupled to the electronic panel EP, for example. Here, the second liner LIN2 may protect the adhesion part disposed on the second surface TF-B of the flexible circuit board TF.

In this exemplary embodiment, the first liner LIN1 may have a surface area greater than that of the second liner LIN2, and the first liner LIN1 may be relatively more rigid than the second liner LIN2. Also, the first liner LIN1 may have a first thickness TH1 greater than a second thickness TH2 of the second liner LIN2.

Referring to FIG. 6C, the flexible circuit board TF may be divided into a plurality of areas. In an exemplary embodiment, the flexible circuit board TF may include a sensing pad area PD-A, a connector area CNT-A, a connection area EX-A, and bending areas BD-A1 and BD-A2, for example.

The sensing pad area PD-A may be an area on which the sensing pads TF-PD are disposed. The connector area CNT-A may be an area on which a sensing connector T-CNT is disposed. The connection area EX-A may be disposed between the sensing pad area PD-A and the connector area CNT-A.

In an exemplary embodiment, the first liner LIN1 and the second liner LIN2 may not overlap a partial area of the flexible circuit board TF. In an exemplary embodiment, the first liner LIN1 and the second liner LIN2 may not overlap the sensing pad area PD-A and the connector area CNT-A of the flexible circuit board TF in the plan view, for example. Thus, the sensing pads TF-PD and the sensing connector T-CNT may be exposed to the outside from the first liner LIN1 and the second liner LIN2. Thus, the first liner LIN1 and the second liner LIN2 may connect the flexible circuit board TF to the electronic panel EP even through the first liner LIN1 and the second liner LIN2 are coupled to the flexible circuit board TF.

A first bending area BD-A1 may be disposed between the sensing pad area PD-A and the connection area EX-A. The first bending area BD-A1 may be an area that is bent with respect to a first virtual bending axis AX1 extending in the second direction DR2 when the flexible circuit board TF is bent to the rear surface of the electronic panel EP.

The second bending area BD-A2 may be disposed between the connector area CNT-A and the connection area EX-A. The second bending area BD-A2 may be an area that is bent with respect to a second virtual bending axis AX2 extending in the first direction DR1 in a state in which the first bending area BD-A1 is bent to the rear surface of the electronic panel EP.

Depending on the purpose, processes of accommodating, transferring, assembling, or storing only the circuit board assembly SU before the circuit board assembly SU is connected to the electronic panel EP may occur. Here, the liners LIN1 and LIN2 may cover the different surfaces of the flexible circuit board TF to prevent the flexible circuit board TF from being damaged during the accommodation, the transfer, the assembly, or the storage.

Figure 7:
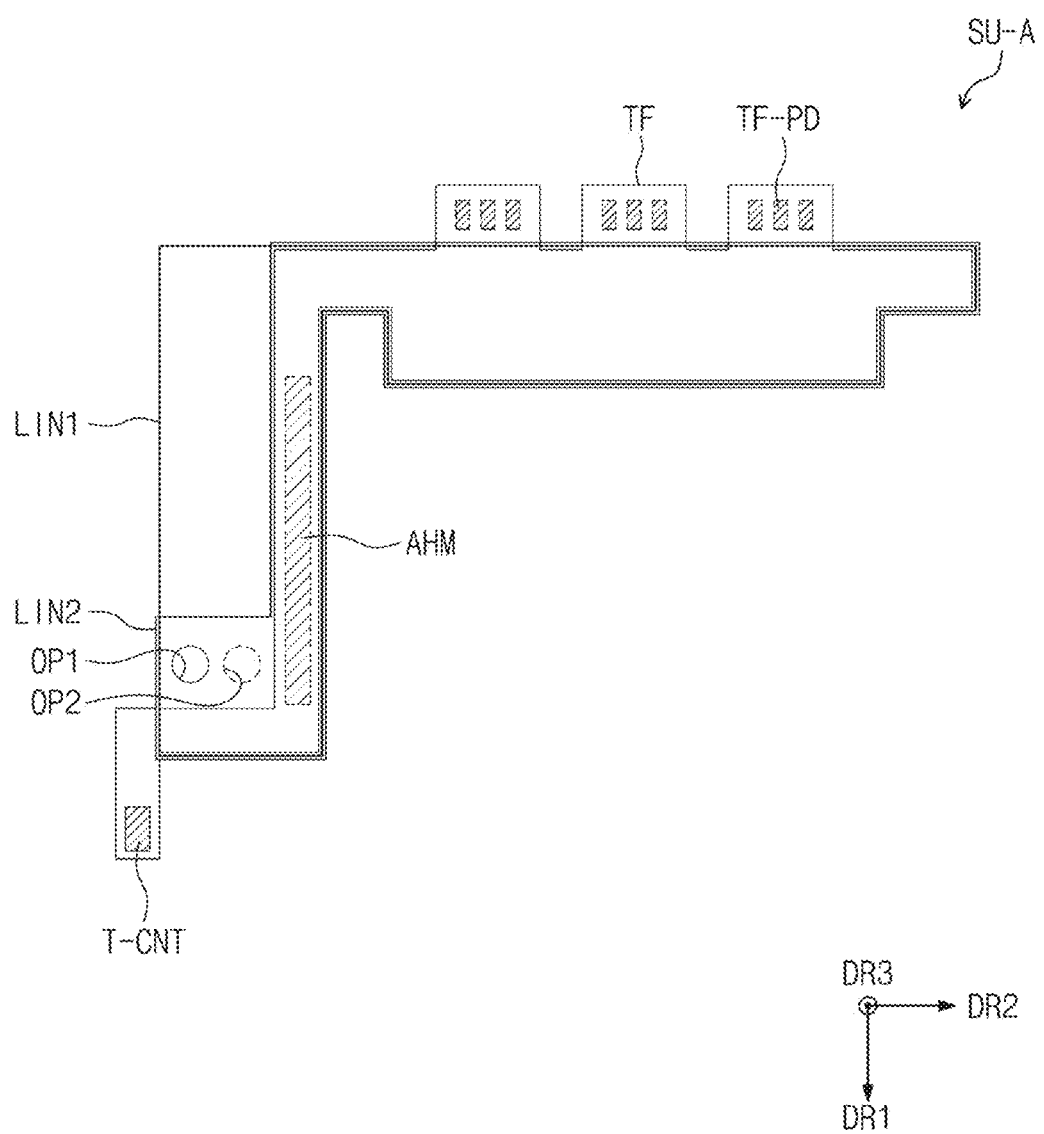
FIG. 7 is a plan view of an exemplary embodiment of the circuit board assembly according to the invention.

FIG. 7 is a plan view of an exemplary embodiment of the circuit board assembly according to the invention. The same/similar reference numerals are used for the same components as those of FIGS. 1A to 6C, and thus, their duplicated descriptions will be omitted.

Referring to FIG. 7, a circuit board assembly SU-A in an exemplary embodiment may further include an adhesion part AHM. The adhesion part AHM may be disposed between the second liner LIN2 and the flexible circuit board TF. The adhesion part AHM may be disposed on at least a portion of the second surface TF-B of the flexible circuit board TF. The adhesion part AHM may be covered by the second rear surface L2-B (refer to FIG. 5B) of the second liner LIN2.

Adhesion force of the adhesion part AHM with respect to the second surface TF-B of the flexible circuit board TF may be greater than that of the adhesion part AHM with respect to the second rear surface L2-B of the second liner LIN2. Thus, when the second liner LIN2 is removed from the flexible circuit board TF, the adhesion part AHM may be attached to the second surface TF-B of the flexible circuit board TF.

Thus, when the first bending area BD-A1 (refer to FIG. 6C) is bent to be attached to the rear surface of the electronic panel EP (refer to FIG. 1C) after the second liner LIN2 is removed from the flexible circuit board TF, coupling force between the flexible circuit board TF and the electronic panel EP may increase.

The adhesion part AHM may include an adhesive material. In an exemplary embodiment, the adhesion part AHM may be a pressure sensitive adhesive ("PSA"), an optical clear adhesive ("OCA"), or an optical clear resin ("OCR"), for example. Also, the adhesion part AHM may include a photocurable adhesive material or a thermosetting adhesive material, but is not specifically limited thereto.

Figure 8:
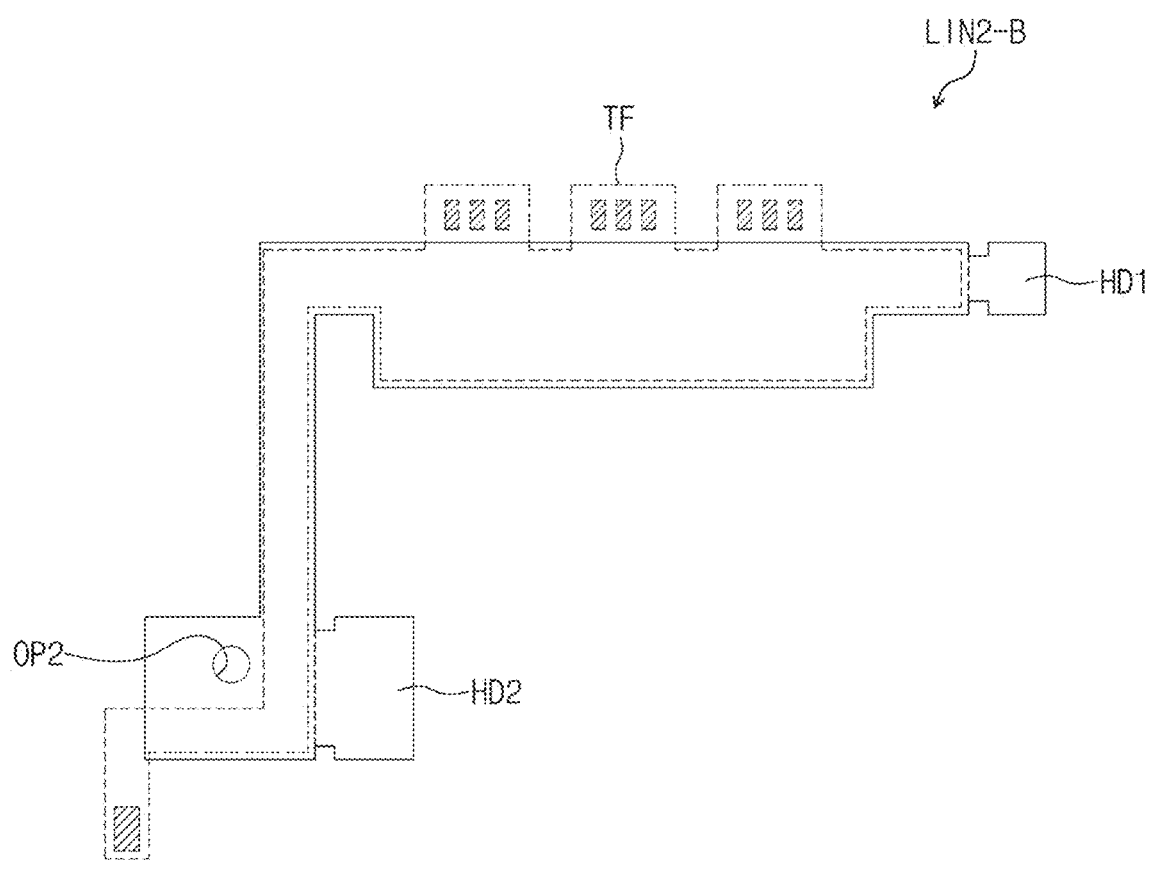
FIG. 8 is a plan view illustrating an exemplary embodiment of one component of the circuit board assembly according to the invention.

FIG. 8 is a plan view illustrating an exemplary embodiment of one component of the circuit board assembly according to the invention. The same/similar reference numerals are used for the same components as those of FIGS. 1A to 6C, and thus, their duplicated descriptions will be omitted.

Referring to FIG. 8, the second liner LIN2-B in an exemplary embodiment may further include support parts HD1 and HD2. The first support part HD1 may protrude in the second direction DR2 from an area adjacent to the pad area PD-A (refer to FIG. 6C) and the first bending area BD-A1 (refer to FIG. 6C) of the flexible circuit board TF (refer to FIG. 6C).

The second support part HD2 may protrude in the second direction DR2 from an area adjacent to the connector area CNT-A (refer to FIG. 6C) and the second bending area BD-A2 (refer to FIG. 6C) of the flexible circuit board TF (refer to FIG. 6C).

According to this exemplary embodiment, the support parts HD1 and HD2 protruding from the second liner LIN2-B may be provided to more easily hold the circuit board assembly SU (refer to FIG. 5A) during the accommodation, the transferring, or the storage of the circuit board assembly SU.

Figure 9:
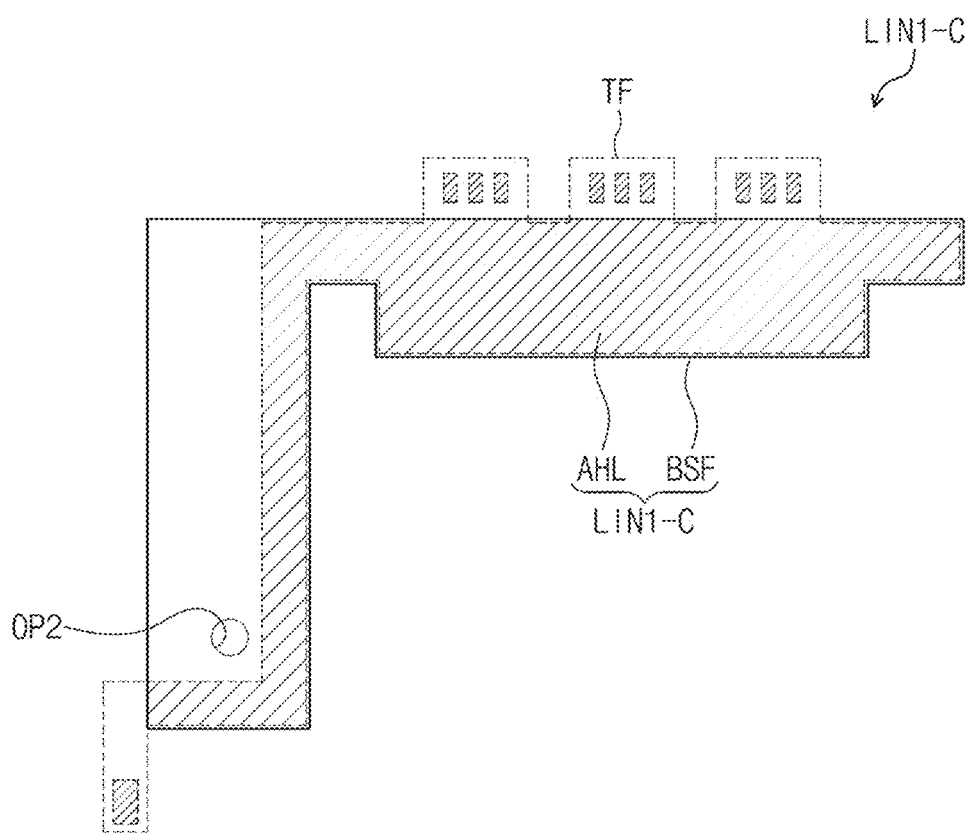
FIG. 9 is a plan view illustrating an exemplary embodiment of one component of the circuit board assembly according to the invention.

FIG. 9 is a plan view illustrating an exemplary embodiment of one component of the circuit board assembly according to the invention. The same/similar reference numerals are used for the same components as those of FIGS. 1A to 6C, and thus, their duplicated descriptions will be omitted.

Referring to FIG. 9, a first liner LIN1-C in an exemplary embodiment may include a base film BSF and an adhesion layer AHL. For convenience of description, the flexible circuit board TF is expressed by a dotted line.

The adhesion layer AHL is attached to the base film BSF. The adhesion layer AHL may be disposed on the base film BSF to overlap at least a portion of the first surface TF-U (refer to FIG. 5) of the flexible circuit board TF (refer to FIG. 5C).

The coupling force between the first liner LIN1-C and the flexible circuit board TF may increase by the adhesion layer AHL when the first liner LIN1-C is attached to the flexible circuit board TF.

The adhesion force of the adhesion layer AHL with respect to the base film BSF may be greater than that of the adhesion layer AHL with respect to the first surface TF-U of the flexible circuit board TF. Thus, even though the first liner LIN1-C is removed from the flexible circuit board TF, the adhesion layer AHL may be maintained to be attached to the base film BSF.

The adhesion layer AHL may include an adhesive material. In an exemplary embodiment, the adhesion layer AHL may be a PSA, an OCA, or an OCR, for example. Also, the adhesion layer AHL may include a photocurable adhesive material or a thermosetting adhesive material or may be provided in the form of a double-sided tape, but is not specifically limited thereto.

FIGS. 10A to 10E are perspective and plan views illustrating a method for manufacturing an electronic panel assembly in an exemplary embodiment of the invention. The same/similar reference numerals are used for the same components as those of FIGS. 1A to 6C, and thus, their duplicated descriptions will be omitted. Hereinafter, a method for manufacturing an electronic panel assembly according to the invention will be described with reference to FIGS. 10A to 10E.

Figure 10A:
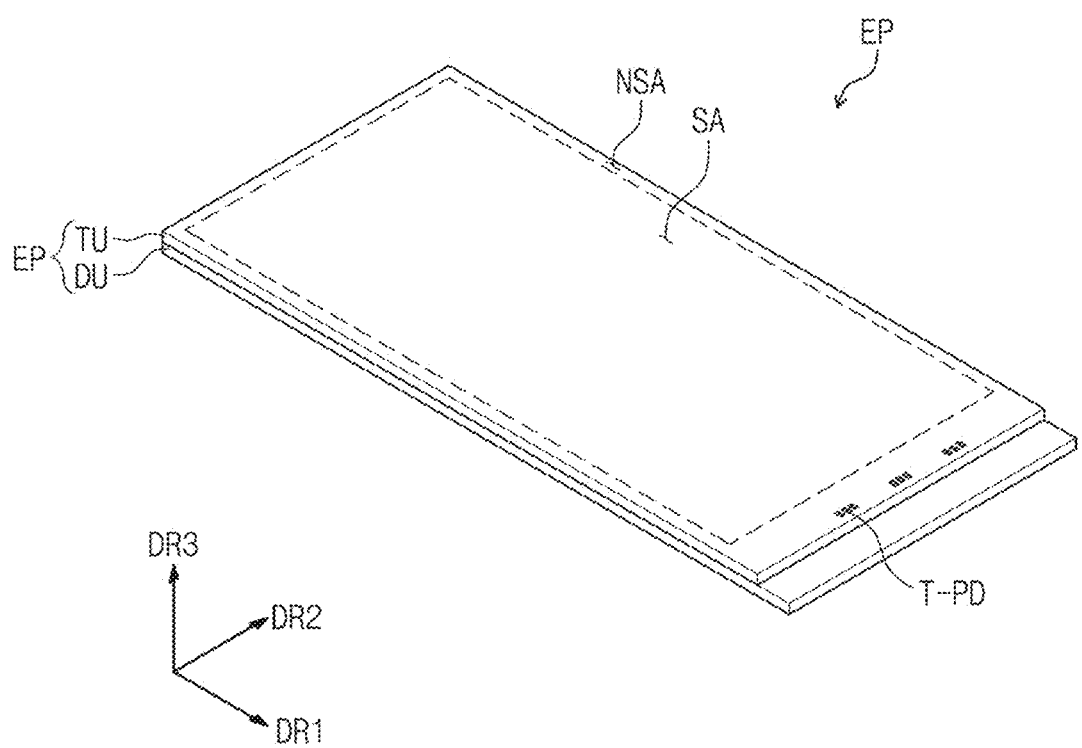
FIGS. 10A to 10F are perspective and plan views illustrating an exemplary embodiment of a method for manufacturing an electronic panel assembly according to the invention.

Referring to FIG. 10A, the method for manufacturing the electronic panel assembly include a process of providing an electronic panel.

In the process of providing the electronic panel EP, the electronic panel EP on which an input sensing unit TU is disposed on a display unit DU may be provided. As described above, when the input sensing unit TU is not directly disposed on the display unit DU but is provided as a separate component that is attached by an adhesion layer, the display unit DU may be omitted in the electronic panel EP.

The input sensing unit TU may be divided into a sensing area SA on which a plurality of sensing electrodes are disposed and a non-sensing area NSA adjacent to the sensing area SA. Second pads T-PD (hereinafter, pads) connected to corresponding sensing electrodes (not shown) may be disposed on the non-sensing area NSA.

The electronic panel EP of FIG. 10A may be the same as the electronic panel EP of FIG. 4.

Figure 10B:
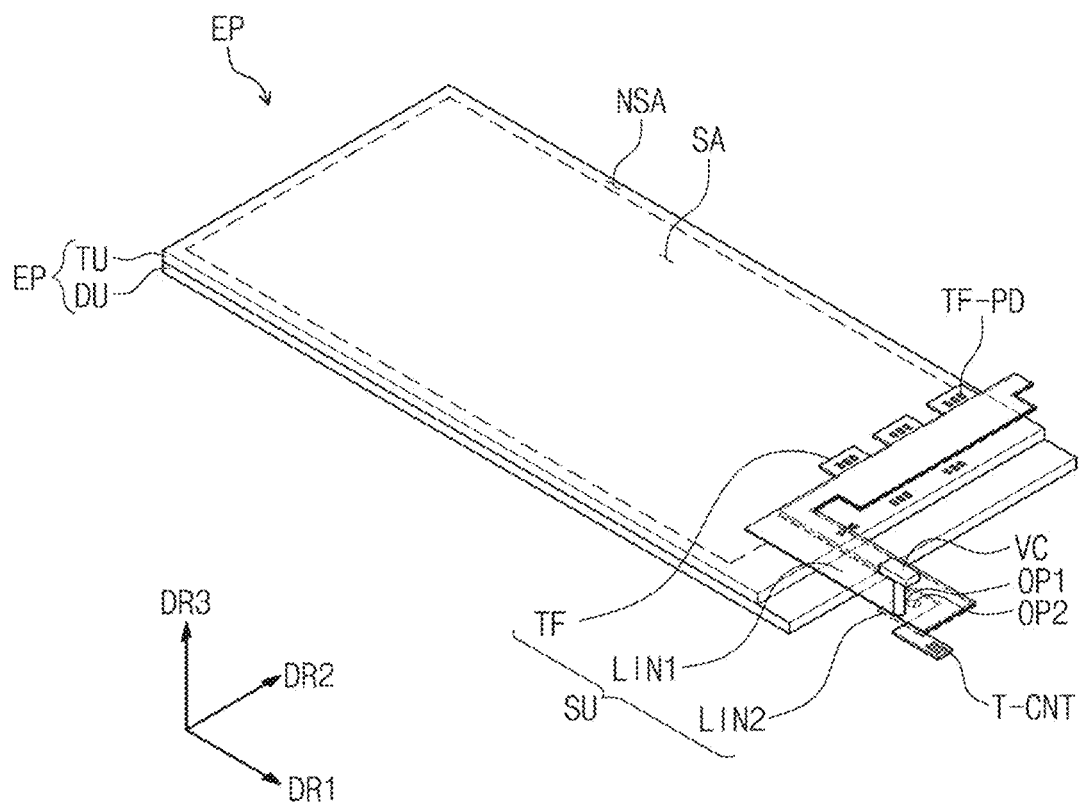

Thereafter, referring to FIG. 10B, the method for manufacturing the electronic panel assembly includes a process of providing the circuit board assembly.

The process of providing the circuit board assembly SU may be performed in a state in which liners LIN1 and LIN2 are attached to a flexible circuit board TF. The liners LIN1 and LIN2 may be provided to be attached to the flexible circuit board TF so that the liners LIN1 and LIN2 cover different surfaces of the flexible circuit board TF.

Openings OP1 and OP2 are defined in the liners LIN1 and LIN2, respectively. The openings OP1 and OP2 may be spaced apart from each other in the plan view. Also, each of the openings OP1 and OP2 may be spaced apart from the flexible circuit board TF. The first opening OP1 provided in the first liner LIN1 may expose a first area PA1 of the second liner LIN2, which overlaps the first opening OP1, to the outside, and the second opening OP2 may expose a second area PA2 of the first liner LIN1, which overlaps the second opening OP2.

Figure 10C:
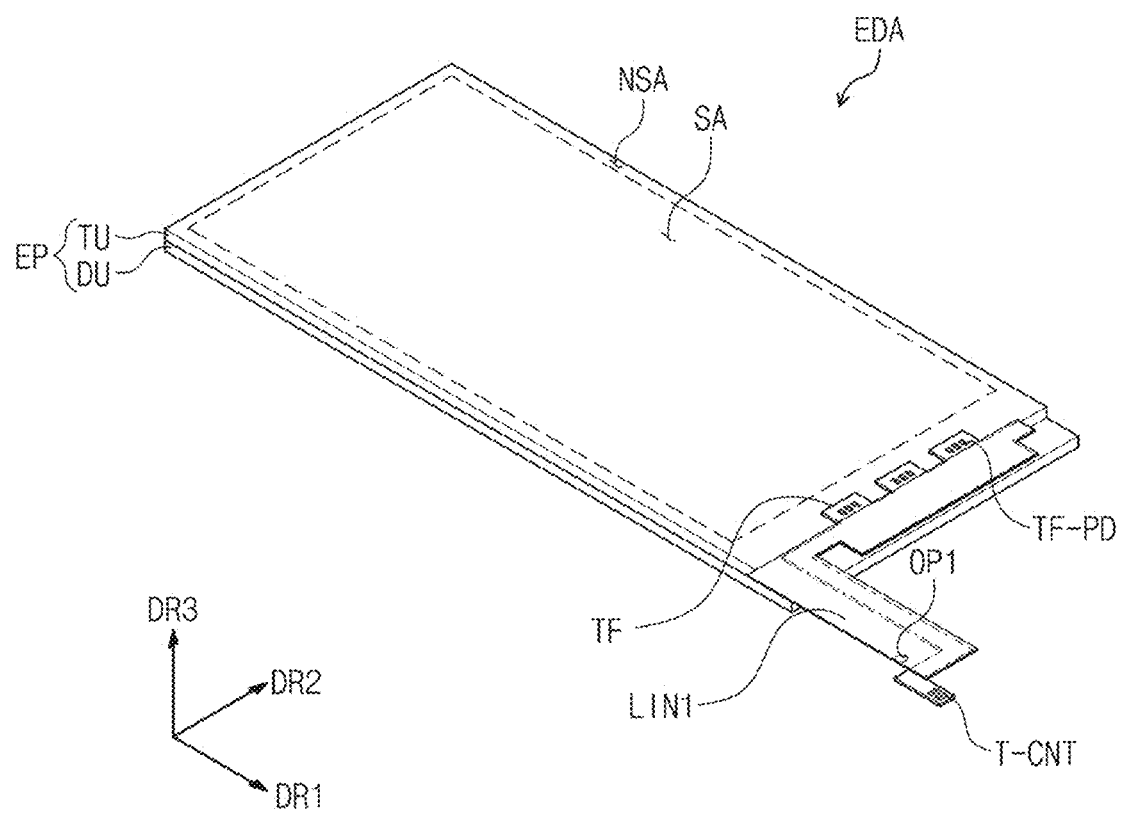

Thereafter, referring to FIG. 10C, the method for manufacturing the electronic panel assembly may include a process of aligning the circuit board assembly with the non-sensing area and a process of connecting the pads to the sensing pads.

The process of aligning the circuit board assembly SU with the non-sensing area NSA may be performed through an inspirator VC (refer to FIG. 10B). The inspirator VC may adsorb the first area PA1 exposed by the first opening OP1 to align the circuit board assembly SU with the non-sensing area NSA of the display unit DU.

The first area PA1 may be one area of the second liner LIN2, and the second liner LIN2 may be a component disposed on a lower end of the circuit board assembly SU. When the first area PA1 is adsorbed through the inspirator VC, the entire circuit board assembly SU may move to easily align the circuit board assembly SU with the non-sensing area NSA of the display unit DU.

After the circuit board assembly SU is aligned with the non-sensing area NSA of the display unit DU, the process of connecting the pads T-PD to the sensing pads TF-PD may be performed. The connection between the pads T-PD and the sensing pads TF-PD may be performed by an anisotropic conductive film or performed by applying a pressure and heat to modify a state of the pads. The connection between the pads may be performed through a general method and may not be limited to a specific exemplary embodiment.

Figure 10D:
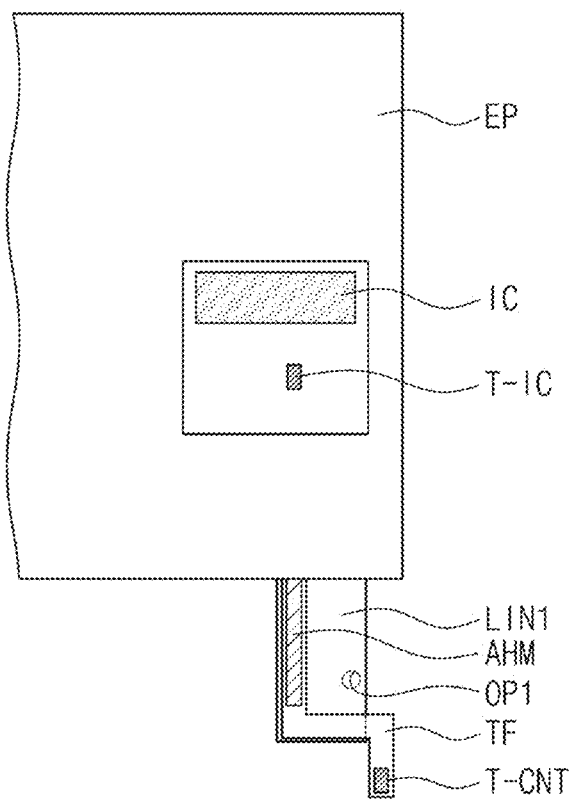
Figure 10D:
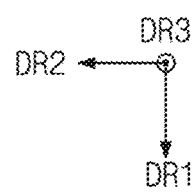

Thereafter, referring to FIG. 10D, the method for manufacturing the electronic panel assembly may include a process of removing the second liner to expose the adhesion part. For convenience of description, FIG. 10D illustrates a plan view when the display unit DU is viewed from the rear surface.

The process of removing the second liner LIN2 to expose the adhesion part AHM may be performed by removing the second liner LIN2 from the flexible circuit board TF.

According to this exemplary embodiment, the adhesion part AHM may be provided between the second liner LIN2 and the flexible circuit board TF. The adhesion part AHM may substantially remain on the flexible circuit board due to a difference in adhesion force while the adhesion part AHM is attached to the second liner LIN2, and the second liner LIN2 is removed from the flexible circuit board TF.

Figure 10E:
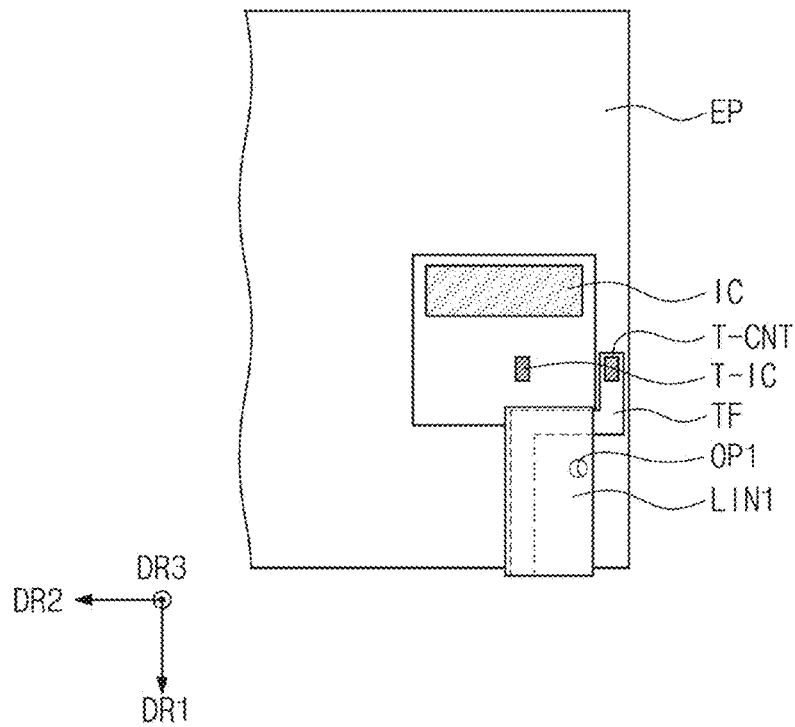
Figure 10F:
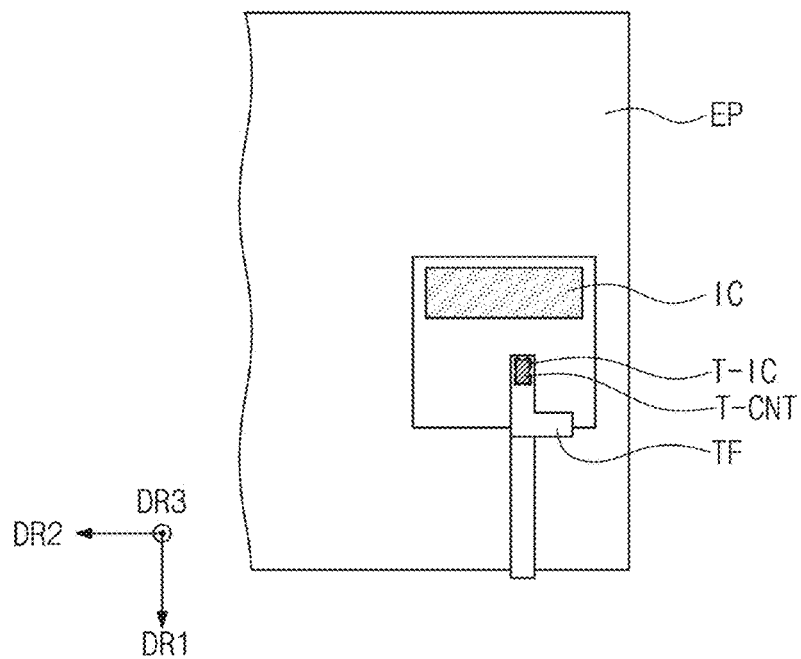

Thereafter, referring to FIGS. 10E and 10F, the method for manufacturing the electronic panel assembly may include a process of bending the circuit board assembly, a process of attaching the flexible circuit board to the electronic panel, and a process of removing the first liner.

In the process of bending the circuit board assembly SU, the flexible circuit board TF may be bent to face the rear surface of the electronic panel EP in the state in which the first liner LIN1 is attached to the flexible circuit board TF. The process of attaching the flexible circuit board TF to the electronic panel EP may be performed by removing the second liner LIN2 so that the exposed adhesion part AHM and the rear surface of the electronic panel EP adhere to each other.

Thereafter, the process of removing the first liner LIN1 may be performed in the state in which the flexible circuit board TF is attached to the rear surface of the electronic panel EP. After the first liner LIN1 is removed, a sensing connector T-CNT may be connected to a connector T-IC connected to a driving element IC.

According to the invention, the liners LIN1 and LIN2 covering the different surfaces of the flexible circuit board TF may be provided to prevent the flexible circuit board TF from being damaged during accommodation, transferring, assembly, or storage of the flexible circuit board TF.

As described above, the liners covering the different surfaces of the flexible circuit board may be provided to prevent the flexible circuit board from being damaged during the accommodation, the transferring, and assembly, or the storage.

It will be apparent to those skilled in the art that various modifications and variations may be made in the invention. Thus, it is intended that the invention covers the modifications and variations of this invention provided they come within the scope of the appended claims and their equivalents.

Hence, the real protective scope of the invention shall be determined by the technical scope of the accompanying claims.

What is claimed is:

1. A circuit board assembly comprising:
a flexible circuit board comprising a first surface, a second surface which is opposite to the first surface, a plurality of sensing pads disposed on the first surface, and a connector disposed on the second surface;
a first liner which comprises a first rear surface which covers at least a portion of the first surface and a first top surface which is opposite to the first rear surface and in which a first opening passing through the first rear surface from the first top surface is defined;
a second liner which comprises a second rear surface which covers at least a portion of the second surface and a second top surface which is opposite to the second rear surface and in which a second opening passing through the second rear surface from the second top surface is defined,
wherein each of the first opening and the second opening is spaced apart from the flexible circuit board in a plan view.

2. The circuit board assembly of claim 1, wherein the first opening and the second opening do not overlap each other in the plan view.

3. The circuit board assembly of claim 1, wherein the first opening exposes a first area of the second rear surface of the second liner, and
the second opening exposes a second area of the first rear surface of the first liner,
wherein the first area and the second area do not overlap each other in the plan view.

4. The circuit board assembly of claim 1, wherein the first liner has a surface area greater than a surface area of the second liner.

5. The circuit board assembly of claim 1, wherein the first liner is relatively more rigid than the second liner.

6. The circuit board assembly of claim 1, further comprising an adhesion part disposed on at least a portion of the second surface and covered by the second liner.

7. The circuit board assembly of claim 1, wherein the first liner comprises a base film and an adhesion layer disposed on the base film to overlap the flexible circuit board.

8. The circuit board assembly of claim 1, wherein the plurality of sensing pads is exposed from the second liner, and
the connector is exposed from the first liner.

9. An electronic panel assembly comprising:
an electronic panel comprising:
a display unit, which is divided into a display area and a non-display area adjacent to the display area and comprises:
a plurality of pixels disposed on the display area, and
an input sensing unit, which is divided into a sensing area disposed to the display unit to overlap the display area and a non-sensing area adjacent to the sensing area and comprises a plurality of sensing electrodes and pads connected to the sensing electrodes; and
a circuit board assembly connected to one end of the non-sensing area, the circuit board assembly comprising:
a flexible circuit board comprising a first surface, a second surface which is opposite to the first surface, a plurality of sensing pads disposed on the first surface and connected to the pads, and a connector disposed on the second surface and spaced apart from the pads;
a first liner which covers at least a portion of the first surface and in which a first opening is defined; and
a second liner which covers at least a portion of the second surface and in which a second opening is defined,
wherein the first opening and the second opening are spaced apart from each other in a plan view.

10. The electronic panel assembly of claim 9, wherein each of the first opening and the second opening is spaced apart from the flexible circuit board.

11. The electronic panel assembly of claim 9, wherein the first opening exposes a first area of a second rear surface of the second liner, and
the second opening exposes a second area of a first rear surface of the first liner,
wherein the first area and the second area do not overlap each other in the plan view.

12. The electronic panel assembly of claim 9, wherein the first liner has a surface area greater than a surface area of the second liner.

13. The electronic panel assembly of claim 9, wherein the first liner is relatively more rigid than the second liner.

14. The electronic panel assembly of claim 9, further comprising an adhesion part disposed on at least a portion of the second surface and covered by the second liner.

15. The electronic panel assembly of claim 9, wherein the first liner comprises a base film and an adhesion layer disposed on the base film to overlap the flexible circuit board.

16. The electronic panel assembly of claim 9, wherein the flexible circuit board is divided into:
a sensing pad area on which the plurality of sensing pads is disposed;
a connector area on which the connector is disposed;
a connection area disposed between the sensing pad area and the connector area;

a first bending area disposed between the sensing pad area and the connection area; and a second bending area disposed between the connector area and the connection area.

17. The electronic panel assembly of claim 16, wherein the first bending area is bent toward a rear surface of the electronic panel with respect to a first virtual bending axis extending in one direction, and the second bending area is bent toward the rear surface of the electronic panel with respect to a second virtual ending axis extending in a direction crossing the one direction in the state in which the first bending area is bent.

18. The electronic panel assembly of claim 16, wherein each of the first liner and the second liner does not overlap the sensing pad area and the connector area of the flexible circuit board in the plan view.

19. The electronic panel assembly of claim 9, wherein the first liner has a thickness greater than a thickness of the second liner.

20. A method for manufacturing an electronic panel, the method comprising:

providing the electronic panel which is divided into a sensing area and a non-sensing area adjacent to the sensing area and on which a plurality of pads disposed on the non-sensing area are formed;

providing a circuit board assembly comprising a first liner in which a first opening is defined, a second liner in which a second opening spaced apart from the first opening is formed, a flexible circuit board which is provided between the first liner and the second liner and on which sensing pads spaced apart from each other are formed, and an adhesion part attached between the flexible circuit board and the second liner;

adsorbing a first area of the second liner, which is exposed through the first opening, through an inspirator to align the circuit board assembly on the non-sensing area;

connecting the pads to the sensing pads;

removing the second liner from the circuit board assembly to expose the adhesion part;

adsorbing a second area of the first liner, which is exposed through the second opening, through the inspirator to bend the circuit board assembly;

attaching the flexible circuit board to the electronic panel through the exposed adhesion part; and removing the first liner from the circuit board assembly.

* * * * *